(12) United States Patent
Matsuda et al.

(10) Patent No.: US 7,496,127 B2
(45) Date of Patent: Feb. 24, 2009

(54) OPTICAL DEVICE COUPLING LIGHT PROPAGATING IN OPTICAL WAVEGUIDE WITH DIFFRACTION GRATING

(75) Inventors: Manabu Matsuda, Kawasaki (JP); Tsuyoshi Yamamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/400,527

(22) Filed: Apr. 10, 2006

(65) Prior Publication Data

US 2007/0133648 A1 Jun. 14, 2007

(30) Foreign Application Priority Data

Dec. 9, 2005 (JP) ............................. 2005-355992
Feb. 16, 2006 (JP) ............................. 2006-038840

(51) Int. Cl.
*H01S 3/08* (2006.01)
(52) U.S. Cl. ................. 372/102; 372/43.01; 372/50.11; 372/75; 372/96; 385/14; 385/27; 385/28; 385/37; 385/129
(58) Field of Classification Search .............. 372/43.01, 372/50.11, 75, 96; 385/14, 27, 28, 37, 129, 385/130, 131, 132
See application file for complete search history.

(56) References Cited

U.S. PATENT DOCUMENTS

| 4,982,409 | A | * | 1/1991 | Kinoshita et al. | ......... 372/45.01 |
| 5,292,685 | A | * | 3/1994 | Inoguchi et al. | ................ 438/32 |
| 5,367,177 | A | * | 11/1994 | Taylor et al. | ................... 257/20 |
| 5,982,804 | A | * | 11/1999 | Chen et al. | .................... 372/96 |
| 6,291,256 | B1 | * | 9/2001 | Chen et al. | .................... 438/32 |
| 6,292,503 | B1 | * | 9/2001 | Watanabe et al. | ......... 372/45.01 |
| 6,573,116 | B2 | * | 6/2003 | Watanabe et al. | ............. 438/32 |
| 6,628,850 | B1 | * | 9/2003 | Yao | .............................. 385/10 |
| 6,671,306 | B1 | * | 12/2003 | Forchel et al. | ................. 372/96 |
| 2001/0046246 | A1 | * | 11/2001 | Watanabe et al. | ............. 372/45 |
| 2001/0048704 | A1 | * | 12/2001 | Matsuda | ...................... 372/43 |
| 2002/0141467 | A1 | * | 10/2002 | Iwai et al. | ...................... 372/45 |
| 2005/0129084 | A1 | * | 6/2005 | Kamp et al. | ................... 372/96 |
| 2006/0109542 | A1 | * | 5/2006 | Mizuuchi et al. | ............ 359/330 |

FOREIGN PATENT DOCUMENTS

JP 2003-152273 5/2003

OTHER PUBLICATIONS

Y. Watanabe et al., "Laterally Coupled Strained MQW Ridge Waveguide Distributed-Feedback Laser Diode Fabricated by Wet-Dry Hybird Etching Process," IEEE Photonics Technology Letters, vol. 10, No. 12, Dec. 1998, pp. 1688-1690.

* cited by examiner

*Primary Examiner*—Minsun Harvey
*Assistant Examiner*—Yuanda Zhang
(74) *Attorney, Agent, or Firm*—Kratz, Quintos & Hanson, LLP.

(57) ABSTRACT

An optical waveguide propagates a laser beam. Main diffraction grating and sub-diffraction grating couple light propagating in the optical waveguide. The main diffraction grating and the sub-diffraction grating couple the light in such a manner that propagation in a second order transverse mode of the light propagating in the optical waveguide when both the main diffraction grating and the sub-diffraction grating are disposed, is suppressed more than propagation in the second order transverse mode of the light propagating in the optical waveguide when only the main diffraction grating is disposed.

15 Claims, 36 Drawing Sheets

OPTICAL DEVICE COUPLING LIGHT PROPAGATING IN OPTICAL WAVEGUIDE WITH DIFFRACTION GRATING

CROSS REFERENCE TO RELATED APPLICATION

This application is based on and claims priority of Japanese Patent Applications No. 2006-038840 filed on Feb. 16, 2006 and No. 2005-355992 filed on Dec. 9, 2005, the entire contents of which are incorporated herein by reference.

BACKGROUND OF THE INVENTION

A) Field of the Invention

The present invention relates to an optical device in which light propagating in an optical waveguide is made to have a narrow spectrum by coupling the light with diffraction gratings.

The present invention further relates to an optical device having the structure of raising a coupling coefficient between light propagating in an optical waveguide and diffraction gratings.

B) Description of the Related Art

With a tremendous increase in Internet demands, efforts geared to ultra high speed and large capacity optical communication and optical transmission are intensified. For the Ethernet (registered trademark) having more than gigabit transmission band, a semiconductor laser diode has been sought which is low-cost and capable of direct modulation of 10 Gb/s or higher in an uncooled state. Examples of a semiconductor laser diode capable of meeting this requirement include a distributed-feedback (DFB) laser diode.

In order to manufacture a DFB laser diode at a low cost, a ridge-waveguide distributed-feedback laser diode is promising which can be manufactured by performing crystal growth once, i.e., second crystal growth after an etching process is not necessary. In forming a diffraction grating for distributed-feedback on a ridge-waveguide distributed-feedback laser diode, forming a diffraction grating on both sides of a ridge has a greater advantage in terms of manufacture cost than forming a diffraction grating in crystal.

FIG. 24 is a perspective view of a conventional ridge-waveguide DFB laser diode. An active layer 501 and a clad layer 502 are sequentially laminated on a semiconductor substrate 500. A ridge 503 extending along one direction is formed on the clad layer 502. A diffraction grating 504 is formed on both side surfaces of the ridge 503. The active layer 501 under the ridge 503 functions as an optical waveguide.

FIG. 25 shows another example of the conventional ridge-waveguide DFB laser diode. Although the diffraction grating 504 of the ridge-waveguide DFB laser diode shown in FIG. 24 is formed on both side surfaces of the ridge 503, in the example shown in FIG. 25 a diffraction grating 504A is formed on flat surfaces on both sides of a ridge 503, in place of the diffraction grating 504. The other structures are the same as those of the laser diode shown in FIG. 24.

FIG. 26 shows a position relation between light propagating in an optical waveguide and diffraction gratings. Diffraction gratings 504 or 504A are disposed on both sides of a ridge 503. An intensity distribution of light of a fundamental transverse mode has a maximum at the center of the ridge 503 in a width direction and the intensity gradually lowers as the position recedes from the center, as indicated by a solid line 510. An intensity distribution of light in a first high order transverse. mode (hereinafter, abbreviated as "second order transverse mode") has a minimum at the center of the ridge 503 in the width direction, gradually increases its intensity and has maximum values on both sides of the ridge, as indicated by a solid line 511. In an area outside the positions at the maximum values, the intensity of light lowers monotonously as the position recedes from the center of the ridge 503.

Since the diffraction grating is not disposed near at the center of the ridge 503 but disposed on both sides of the ridge 503, the intensity of light in the second order transverse mode in an area where the diffraction gratings are disposed is higher than that of light in the fundamental transverse mode. Therefore, a coupling coefficient between the second order transverse mode and the diffraction gratings is about 1.5 to 2 times as that between the fundamental transverse mode and the diffraction gratings. Oscillation in the second order transverse mode is therefore likely to be generated.

In order to lower the coupling coefficient between the second order transverse mode and the diffraction gratings, it is necessary to make the ridge 503 thinner and to bring the diffraction gratings closer to the center of the ridge 503. However, as the ridge 503 is made thinner, electric resistance of the laser diode increases. Making the ridge 503 thinner results in an increase in power consumption and a reduction of optical output to be caused by heat generation during large current injection.

JP-A-2003-152273 discloses a semiconductor laser diode capable of suppressing higher order transverse modes.

FIG. 27 is a horizontal cross sectional view showing a ridge portion of a semiconductor leaser diode disclosed in JP-A-2003-152273. A diffraction grating 521 is formed on both side surfaces of a ridge 520. An optical absorption layer 522 of InGaAs is formed on the outer concave and convex surfaces of the diffraction grating 521, the optical absorption layer being absorbent to oscillation light. The optical absorption layer 522 absorbs light in higher order transverse modes more than in the fundamental transverse mode, so that oscillation in the higher order modes can be suppressed.

Next, description will be made on a transverse mode of light in a laser diode having a buried waveguide (hereinafter called a buried-heterostructure laser diode).

FIG. 28 is a perspective view of a conventional buried-heterostructure laser diode. A mesa portion 551 extending in one direction is formed on the surface of a semiconductor substrate 550. A diffraction grating 552 is formed on the upper surface of the mesa portion 551, and an active layer 553 is formed on the diffraction grating 552. A burying layer 555 is formed on a flat surface on both sides of the mesa portion 551. A current confinement layer 556 is formed on the burying layers 555. An upper clad layer 557 covers the active layer 553 and current confinement layers 556.

FIG. 29 is a graph showing a relation between the width of the active layer and the coupling coefficient between light and the diffraction gratings of the buried-heterostructure laser diode shown in FIG. 28. A curve a indicates the coupling coefficient of the fundamental transverse mode, and a curve b indicates the coupling coefficient of the second order transverse mode.

Since the diffraction grating 552 is disposed on the whole surface of the active layer 553 in the width direction, the coupling coefficient a of the fundamental transverse mode is principally higher than the coupling coefficient b of the second order transverse mode. The second order transverse mode will not oscillate if the width of the active layer 553 is 1.4 µm (cutoff width) or narrower.

SUMMARY OF THE INVENTION

In the laser diode disclosed in JP-A-2003-152273, since the optical absorption layer 522 shown in FIG. 27 exists, a waveguide loss in the fundamental transverse mode increases. Therefore, an oscillation threshold value rises by about 50 to 200%.

In the buried-heterostructure laser diode shown in FIG. 28, the second order transverse mode will not oscillate if the width of the active layer 553 is the cutoff width or narrower. However, if the width of the active layer 553 is made wide as shown in FIG. 29, the coupling coefficient in the second order transverse mode becomes high, and as the active layer 553 is made wide, a difference becomes small between the fundamental transverse mode coupling coefficient and second order transverse mode coupling coefficient. In the example shown in FIG. 29, as the width of the active layer 553 becomes 2.5 µm or wider, the second order transverse mode coupling coefficient takes a value necessary for oscillation. It is therefore not preferable to make the width of the active layer 553 wider than 2.5 µm.

As in the case of the buried-heterostructure laser diode shown in FIG. 28, in a ridge-waveguide DFB laser diode having a diffraction grating disposed in the substrate under the ridge, if the ridge is made wide, the second order transverse mode is likely to oscillate.

In order to improve optical output characteristics of a DFB laser diode, it is effective to make the ridge and active layer wide. It is desired to provide technologies capable of suppressing oscillation in the second order transverse mode even if the ridge and active layer are made wide.

The spaces on both sides of the ridge 503 of the ridge waveguide DFB laser diode shown in FIGS. 24 and 25 are generally filled with atmospheric air or dielectric material such as $SiO_2$ and benzocyclobutene (BCB). A refractive index of these materials is about 1 to 1.7 which is very low as compared to a diffractive index of 3.2 to 3.5 of general semiconductor materials. Because of this refractive index difference, the intensity distribution of light propagating in the active layer 501 along the ridge 503 expands greatly toward the substrate side and expands very narrowly toward the spaces on both sides of the ridge 503. Accordingly, in a DFB laser diode having a diffraction grating disposed on both side surfaces of the ridge 503 or on the flat surfaces on both sides of the ridge 503, the coupling coefficient κ between light and diffraction gratings becomes lower than that of a laser diode having the diffraction grating disposed in the substrate.

A DFB laser diode having the diffraction grating disposed in the substrate has a coupling coefficient κ of about 250 $cm^{-1}$. In contrast, a DFB laser diode having the diffraction grating disposed on the substrate surface has a coupling coefficient κ of about 90 $cm^{-1}$ (Watanabe et al., "Laterally Coupled Strained MQW Ridge Waveguide Distributed-Feedback Laser Diode Fabricated by Wet-Dry Hybrid Etching Process", IEEE Photonics Technology Letters, Vol. 10, No. 12, Dec. 1998).

Generally, in order to improve high speed direct modulation characteristics, it is effective to reduce parasitic capacitance of a laser diode. In order to reduce parasitic capacitance, it is preferable, for example, to set an optical resonator length L of the laser diode to 250 µm or shorter. For example, a laser diode having an optical resonator length L of 250 µm and a coupling coefficient κ of 90 $cm^{-1}$ has a normalized coupling coefficient κL of 2.25. However, an optimum normalized coupling coefficient κL of a quarter wavelength shift DFB laser diode capable of high speed modulation of 10 Gb/s or higher is 2.4 to 2.7. As the normalized coupling coefficient κL becomes smaller than 2.4, a relaxation oscillation frequency lowers which is an index of a modulation speed of a direct modulation operation, so that high speed modulation characteristics at 10 Gb/s or higher cannot be realized. As the normalized coupling coefficient κL becomes larger than 2.7, the distribution of light is concentrated upon a region near the area where the diffraction grating has a phase shift in the axial direction of the optical resonator. Therefore, subsidiary modes to be caused by hole burning in the axial direction are likely to oscillate, hindering a single longitudinal mode oscillation. Further, since light is confined more strongly in the optical resonator, an optical output from the end face lowers.

In order to realize a sufficient normalized coupling coefficient κL of a DFB laser diode having a coupling coefficient κ of about 90 $cm^{-1}$, the optical resonator length L is required to be longer than 250 µm. As the optical resonator length L is made longer than 250 µm, parasitic capacitance becomes large and the high speed modulation characteristics are degraded.

As described above, in a conventional DFB laser diode having the diffraction grating disposed on the substrate surface, it is difficult to satisfy two contradictory conditions: to set the normalized coupling coefficient κL to a suitable value and to realize good high speed modulation characteristics.

According to one aspect of the present invention, there is provided an optical device comprising: an optical waveguide for propagating a laser beam; a main diffraction grating coupling light propagating in the optical waveguide; and a sub-diffraction grating coupling the light propagating in the optical waveguide, wherein the main diffraction grating and the sub-diffraction grating couple the light in such a manner that propagation in a second order transverse mode of the light propagating in the optical waveguide when both the main diffraction grating and the sub-diffraction grating are disposed, is suppressed more than propagation in the second order transverse mode of the light propagating in the optical waveguide when only the main diffraction grating is disposed.

According to another aspect of the present invention, there is provided an optical device comprising: a semiconductor substrate; a lower clad layer formed over the semiconductor substrate; an optical waveguide layer made of medium having a refractive index higher than a refractive index of the lower clad layer; an upper clad layer of a ridge shape extending in one direction over a partial area of the optical waveguide, the upper clad layer being made of medium having a refractive index higher than the refractive index of the lower clad layer; and a diffraction grating having a periodicity in an extending direction of a ridge constituted of the upper clad layer and disposed above the optical waveguide layer.

Since propagation of the second order transverse mode is suppressed, it is possible to propagate light of a single mode including only the fundamental transverse mode.

As the refractive index of the upper clad layer is set higher than that of the lower clad layer, the intensity of light in a region above the active layer becomes strong. It is therefore possible to raise the coupling coefficient between light and diffraction gratings.

DESCRIPTION OF THE PREFERRED EMBODIMENTS

Figure 1:
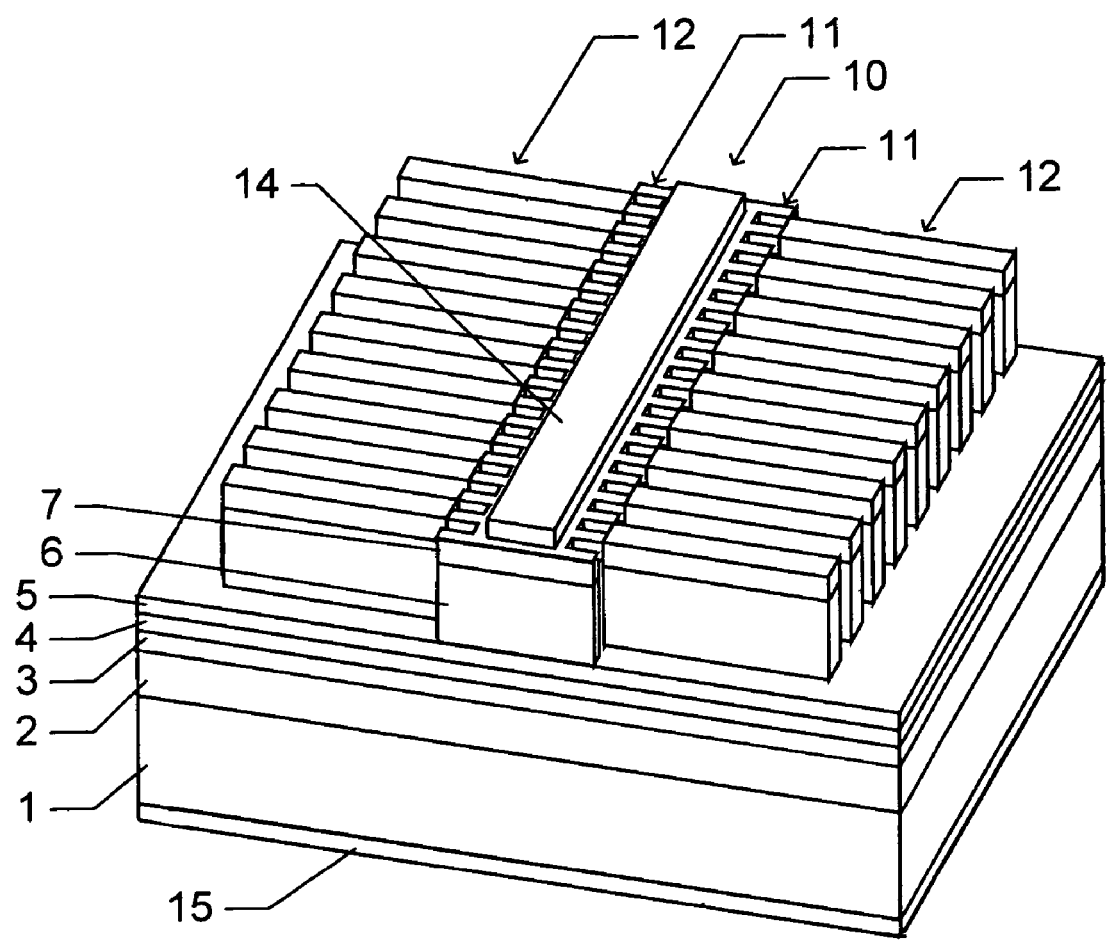
FIG. 1 is a perspective view of a ridge-waveguide DFB laser diode according to a first embodiment.

FIG. 1 is a perspective view of a ridge-waveguide DFB laser diode according to the first embodiment. A lower clad layer 2 of n-type $Al_{0.5}Ga_{0.5}As$ having a thickness of 1.5 μm, a lower optical guide layer 3 of n-type $Al_{0.3}Ga_{0.7}As$ having a thickness of 0.15 μm, a quantum dot active layer (optical waveguide layer) 4 and an upper optical guide layer 5 of p-type $Al_{0.3}Ga_{0.7}As$ having a thickness of 0.15 μm are stacked in this order on the principal surface of a substrate 1 of n-type GaAs are.

The quantum dot active layer 4 has a lamination structure having ten repeating units, each of which has an InGaAs layer containing a number of quantum dots of InAs and GaAs layers sandwiching the InGaAs layer, the ten repeating units being stacked in the thickness direction.

A ridge 10 having a height of 1.4 μm and a width of 2 μm elongated in one direction is disposed on the upper optical guide layer 5. A main diffraction grating 11 is formed on both side surfaces of the ridge 10, the main diffraction grating having a periodicity in a longitudinal direction of the ridge 10. The main diffraction grating 11 has a structure that convex and concave portions extending in a height direction of the ridge 10 are alternately disposed in the longitudinal direction of the ridge 10. A period of the main diffraction grating 11 is 198 nm, and a height from the bottom of the concave portion to the top of the convex portion is 500 nm.

The ridge 10 has a two-layer structure of an upper clad layer 6 of p-type $Al_{0.3}Ga_{0.7}As$ having a thickness of 1.2 μm and a contact layer 7 of p-type GaAs formed on the upper clad layer 6 and having a thickness of 0.2 μm.

A sub-diffraction grating 12 having a periodicity in the longitudinal direction of the ridge 10 is formed on the flat surfaces of the upper optical guide layer 5 on both sides of the ridge 10. The sub-diffraction grating 12 is constituted of a number of convex portions disposed in the longitudinal direction of the ridge 10 at regular intervals. A period of the sub-diffraction grating 12 is 398 nm, i.e., a two-fold of the period of the main diffraction grating 11. The convex portion constituting the sub-diffraction grating 12 has the same two-layer structure as that of the ridge 10, and its height is equal to that of the ridge 10. A size of the convex portion in the longitudinal direction of the ridge 10 is 198 nm. A size of the convex portion in a direction perpendicular to the longitudinal direction of the ridge 10 is 0.5 μm.

The convex portion of the sub-diffraction grating 12 may be disposed in such a manner that the end face of the convex portion contacts the front end of the convex portion of the main diffraction grating 11, or in such a manner that the end face is disposed with a small gap to the front end of the convex portion of the main diffraction grating 11.

A p-side (upper) electrode 14 is formed on the ridge 10, and an n-side (lower) electrode 15 is formed on the bottom of the substrate 1. The upper electrode 14 and lower electrode 15 is made of, for example, AuZn/Au and AuGe/Au, respectively. The semiconductor surface of a laser diode is generally covered with a protective film of silicon oxide, silicon nitride, benzocyclobutene (BCB) or the like.

The quantum dot active layer 4 has an effective refractive index higher than that of any of the lower clad layer 2, lower optical guide layer 3, upper optical guide layer 5 and upper clad layer 6. The region of the quantum dot active layer 4 under the ridge 10 serves as an optical waveguide for propagating light in the longitudinal direction of the ridge 10. Light propagating in the optical waveguide couples the main diffraction grating 11 and sub-diffraction grating 12.

A wavelength λ of light selected by the main diffraction grating 11 is given by:

$$\lambda = 2 \times p_1 \times n_e$$

where $n_e$ is an effective refractive index of the optical waveguide and $p_1$ is the period of the main diffraction grating 11. A voltage is applied across the upper electrode 14 and lower electrode 15 to inject carriers into the quantum dot active layer 4 so that the ridge-waveguide DFB laser diode oscillates at the wavelength λ expressed by the above equation.

In FIG. 1, the periods of the main diffraction grating 11 and sub-diffraction grating 12 are shown relatively large as compared to the size of the whole laser diode. In the drawings accompanying this specification, the period of the diffraction grating is shown relatively large as compared to the size of the whole laser diode.

Figure 2:
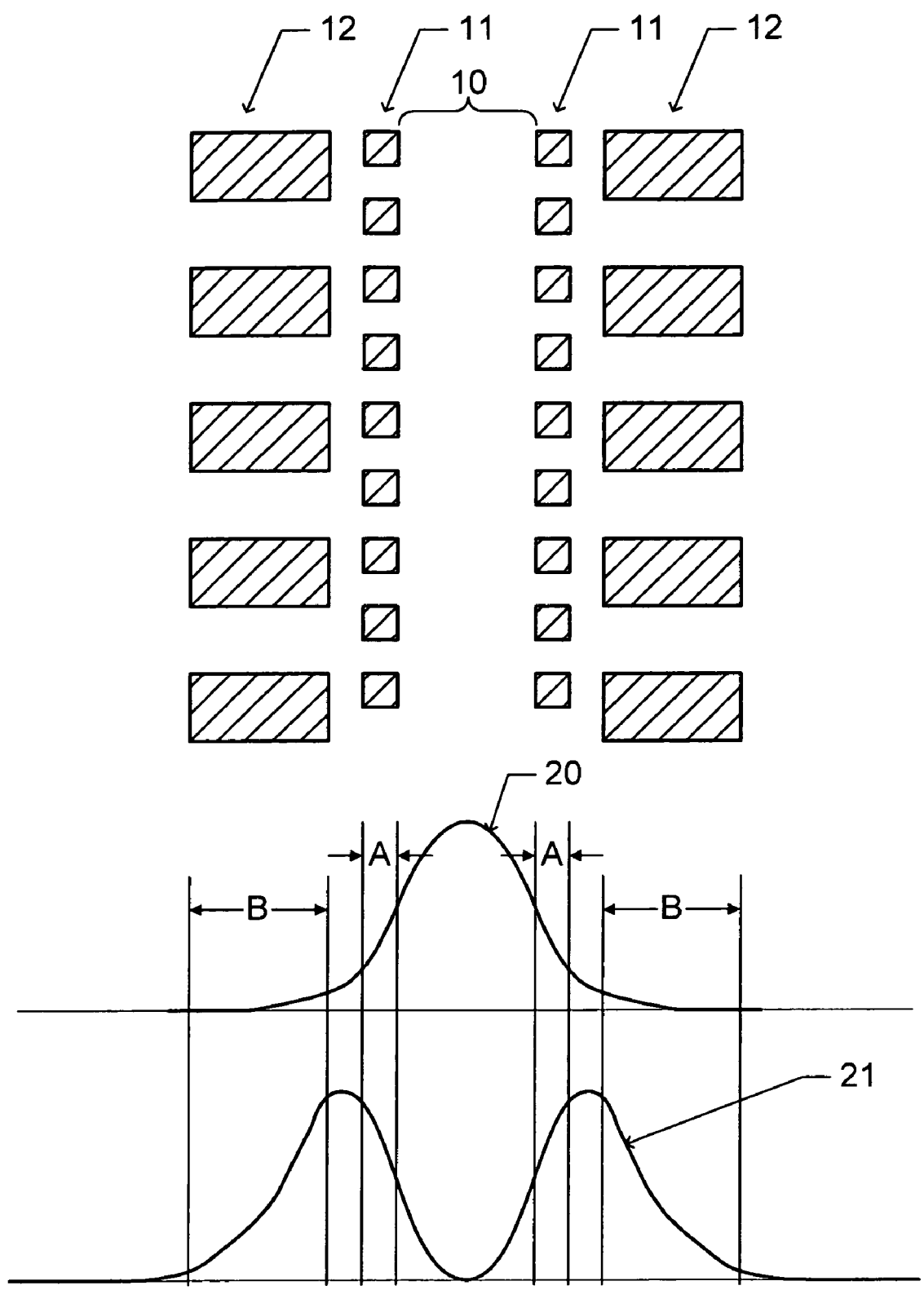
FIG. 2 is a diagram showing a position relation between a main diffraction grating and a sub-diffraction grating of the ridge-waveguide DFB laser diode of the first embodiment and the intensity distribution of light in the fundamental transverse mode and second order transverse mode.

FIG. 2 shows an example of the position relation between the main diffraction grating 11 and sub-diffraction grating 12 of the ridge-waveguide DFB laser diode of the first embodiment and the intensity distribution of light in the transverse direction. The main diffraction grating 11 is disposed on both side surfaces of the ridge 10, the main diffraction grating 11 having a periodical structure that a high refractive index region (convex portion) and a low refractive index region (concave portion) are alternately disposed. The sub-diffraction grating 12 is disposed outside the main diffraction grating 11, the sub-diffraction grating 12 having a periodical structure that a high refractive index region (convex portion) and a low refractive index region are alternately disposed.

The intensity distribution of light in the fundamental transverse mode is indicated by a solid line 20, and the intensity distribution of light in the second order transverse mode is indicated by a solid line 21. The intensity distribution 20 of light in the fundamental transverse mode has a maximum value at the center of the ridge 10 in a width direction, and the light intensity lowers at positions remoter from the center. The intensity distribution 21 of light in the second order transverse mode has a minimum value at the center of the ridge 10 in the width direction, and has maximum values near the side surfaces of the ridge 10.

The second order transverse mode has a relatively high light intensity in both area A where the main diffraction grating 11 is disposed and in area B where the sub-diffraction grating 12 is disposed. The fundamental transverse mode has a relatively high light intensity in the region A where the main diffraction grating 11 is disposed. The light intensity of the fundamental transverse mode in the area B where the sub-diffraction grating 12 is disposed is considerably lower than that in the fundamental transverse mode in the area A where the main diffraction grating 11 is disposed.

Therefore, the coupling coefficient between the fundamental transverse mode and sub-diffraction grating 12 is lower than that between the fundamental transverse mode and main diffraction grating 11. In contrast, the second order transverse mode has a high coupling coefficient with both the main diffraction grating 11 and sub-diffraction grating 12. The following inequality stands:

$$(k11-k12) > (k21-k22)$$

where k11 is a coupling coefficient between the fundamental transverse mode and main diffraction grating 11, k12 is a coupling coefficient between the fundamental transverse mode and sub-diffraction grating 12, k21 is a coupling coefficient between the second order transverse mode and main diffraction grating 11, and k22 is a coupling coefficient between the second order transverse mode and sub-diffraction grating 12.

Namely, the fundamental transverse mode is strongly affected by the main diffraction grating 11, but is hardly affected by the sub-diffraction grating 12. The second order transverse mode is strongly affected by both the main diffraction grating 11 and sub-diffraction grating 12.

Next, with reference to FIG. 3, description will be made on how light having a wavelength selected by the main diffraction grating 11 is affected by the sub-diffraction grating 12.

Figure 3:
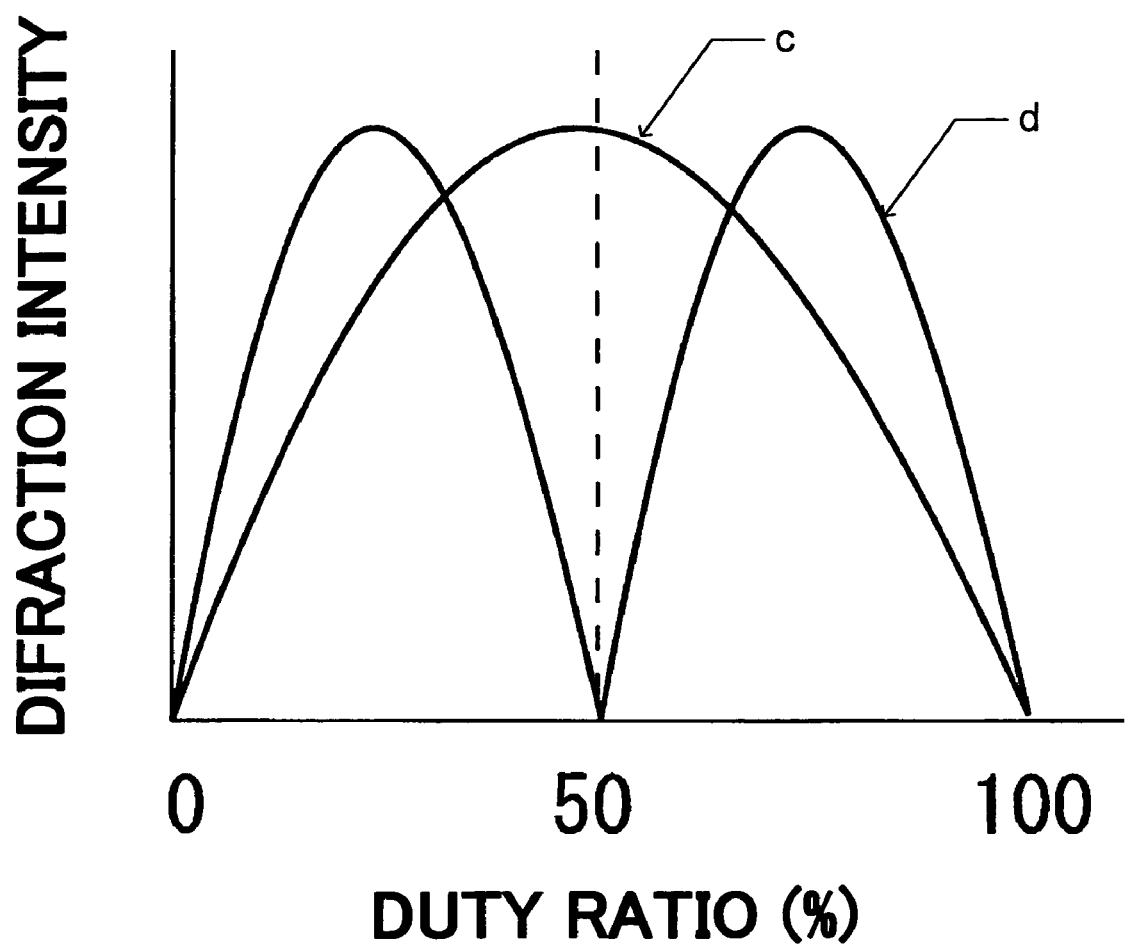
FIG. 3 is a graph showing a relation between a duty ratio of a diffraction grating and a diffraction intensity, a curve c indicating a diffraction intensity in a direction perpendicular to a propagation direction of light and a curve d indicating a diffraction intensity of light in the propagation direction.

FIG. 3 shows a geometrical shape of the sub-diffraction grating 12 and a diffraction intensity. The abscissa of FIG. 3 represents a duty ratio of the convex portion to one period of the sub-diffraction grating 12 in the unit of "%", and the ordinate represents a diffraction intensity in an arbitrary unit. A curve c indicates a diffraction intensity in a direction perpendicular to the substrate surface, and a curve d indicates a diffraction intensity in a propagation direction of light.

At a duty ratio of 50%, the diffraction intensity in the direction normal to the substrate surface reaches its maximum value. As the duty ratio shifts from 50%, the diffraction intensity in the direction normal to the substrate surface dilutes, and at duty ratios of 0% and 100%, the diffraction intensity is 0. The diffraction intensity in the propagation direction of light becomes maximum at duty ratios of 25% and 75%, dilutes as the duty ratio shifts from 25% and 75%, and at duty ratios of 0%, 50% and 100%, the diffraction intensity is 0.

Therefore, a propagation loss of light is large if the duty ratio of the sub-diffraction grating 12 is near 50%. Since the fundamental transverse mode is hardly affected by the sub-diffraction grating 12, a propagation loss in the fundamental transverse mode will not increase. In contrast, in the second order transverse mode, light is strongly coupled to the sub-diffraction grating 12 and diffracted in a direction perpendicular to the waveguide, so that the propagation loss is large.

Light of the second order transverse mode propagating in the optical waveguide and coupled to the main diffraction grating 11 is diffracted by the sub-diffraction grating 12 and re-coupled to the optical waveguide. A "re-coupling degree of the second order transverse mode by the sub-diffraction grating" is defined as a degree at which the diffracted light of the second order transverse mode is re-coupled to the waveguide.

Light of the fundamental transverse mode propagating in the optical waveguide and coupled to the main diffraction grating 11 is diffracted by the sub-diffraction grating 12 and re-coupled to the optical waveguide. A "re-coupling degree of the fundamental transverse mode by the sub-diffraction grating" is defined as a degree at which the diffracted light of the fundamental transverse mode. In the first embodiment, the re-coupling degree of the second order transverse mode by the sub-diffraction grating is weaker than that of the fundamental transverse mode by the sub-diffraction grating. It is therefore possible to suppress oscillation of the second order transverse mode.

In order to obtain sufficient effects of suppressing oscillation of the second order transverse mode, it is preferable to set the duty ratio of the sub-diffraction grating 12 in the range 35%-65%. In the first embodiment, the period of the sub-diffraction grating 12 is set to twice that of the period of the main diffraction grating 11. If the period of the sub-diffraction grating 12 is set to 1.2 times or more than that of the main diffraction grating 11, light is diffracted at an angle not re-coupled to the optical waveguide so that oscillation of the second order transverse mode can be suppressed sufficiently.

In the first embodiment, the fundamental transverse mode and second order transverse mode have been described comparatively. Higher order transverse modes than the second order transverse mode are coupled to the sub-diffraction grating 12 stronger than the fundamental transverse mode. Therefore, the ridge-waveguide DFB laser diode of the first embodiment can suppress oscillation of higher order transverse modes than the second order transverse mode.

Next, with reference to FIGS. 4A to 4D, description will be made on a manufacture method for the ridge-waveguide DFB laser diode of the first embodiment.

Figure 4A:
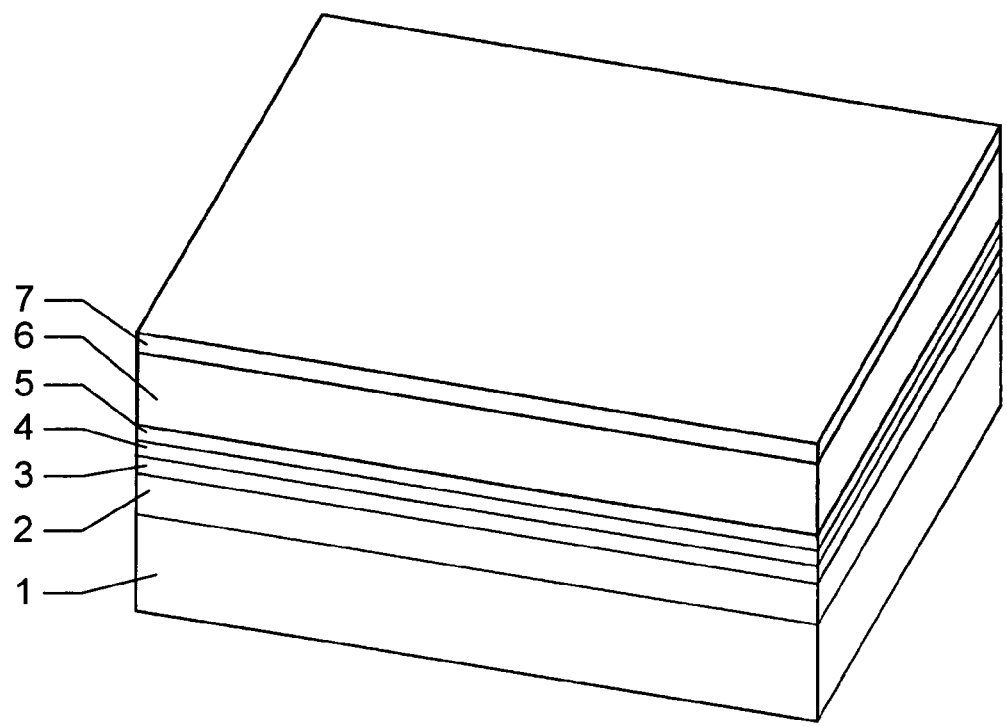
FIGS. 4A to 4D are perspective views illustrating the ridge-waveguide DFB laser diode during manufacture of the first embodiment.

As shown in FIG. 4A, a lower clad layer 2, a lower optical guide layer 3, a quantum dot active layer 4, an upper optical guide layer 5, an upper clad layer 6, and a contact layer 7 are grown on a substrate 1 by molecular beam epitaxy (MBE).

Figure 4B:
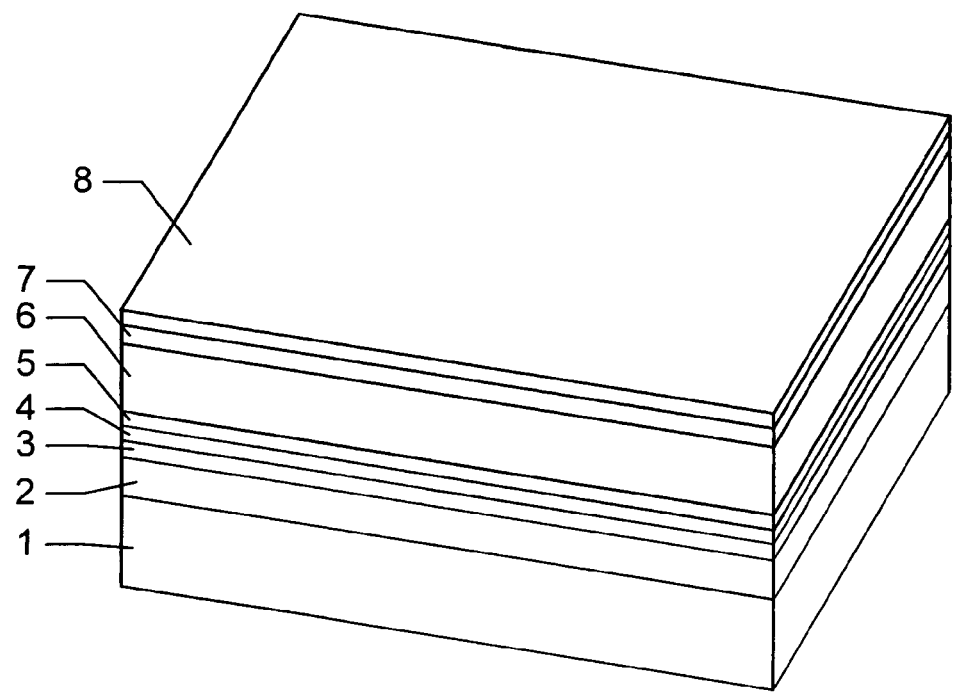

As shown in FIG. 4B, a resist film 8 for electron beam exposure is formed on the contact layer 7.

Figure 4C:
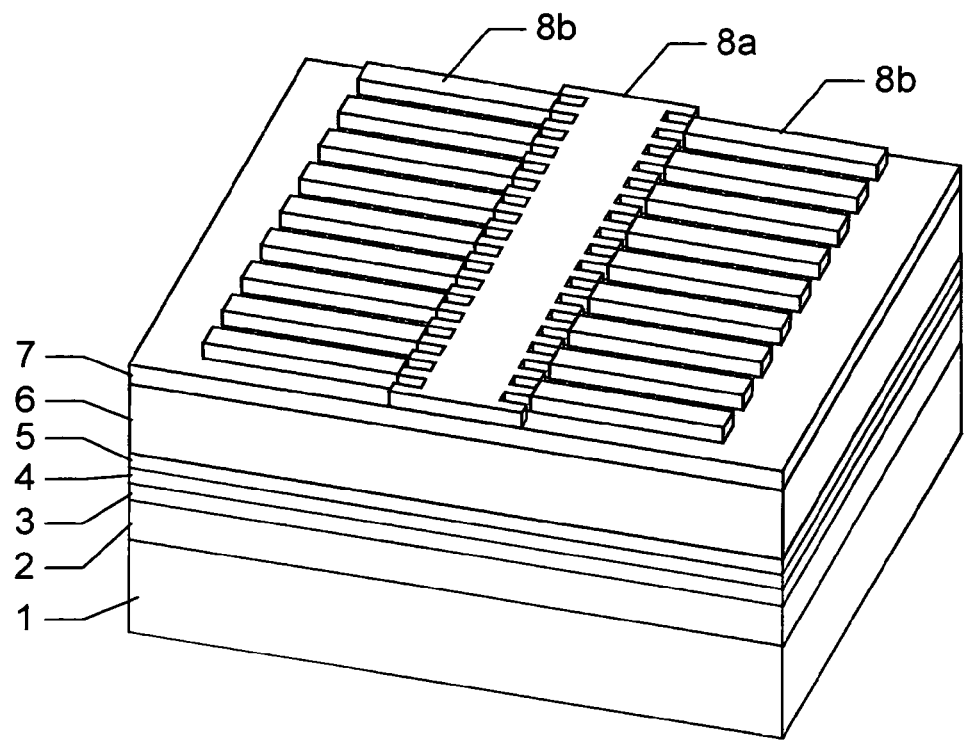

As shown in FIG. 4C, the resist film 8 is exposed by an electron beam and developed to form resist patterns 8a and 8b. The resist pattern 8a corresponds to the plan shape of the ridge 10 (FIG. 1) having the main diffraction grating 11 on both side surfaces thereof, and the resist pattern 8b corresponds to the plan shape of the convex portions of the sub-diffraction grating 12.

By using the resist patterns 8a and 8b as a mask, the contact layer 7 and upper clad layer 6 are etched, and this etching is stopped at the upper surface of the upper optical guide layer 5. Examples of this etching include dry etching using $Cl_2$ as etching gas.

Figure 4D:
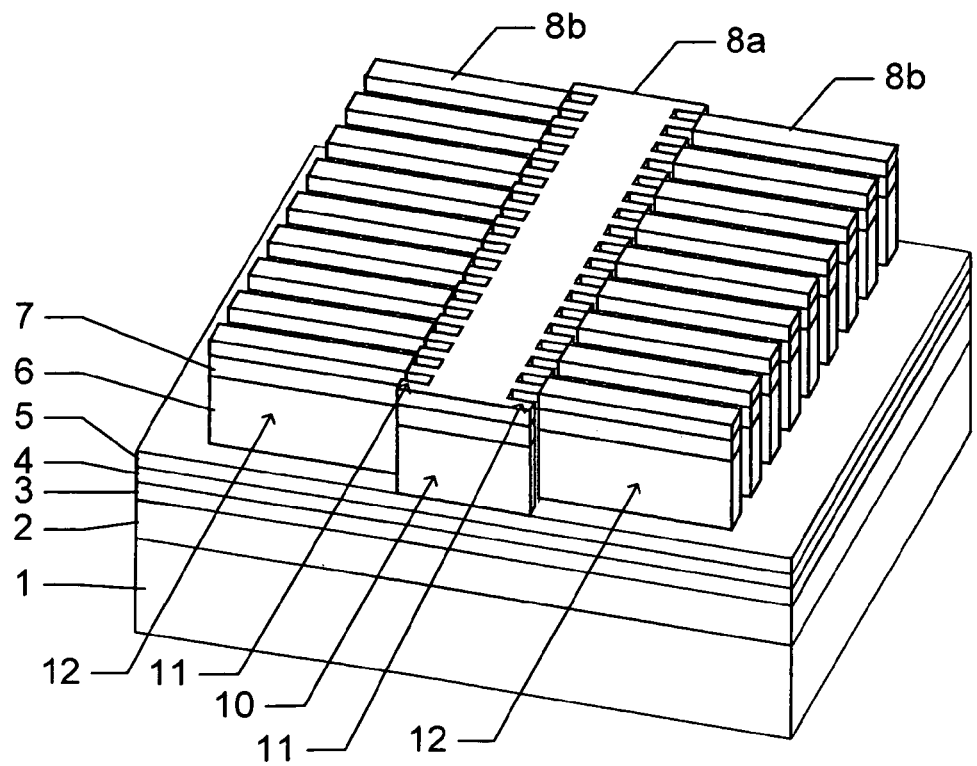

As shown in FIG. 4D, a ridge 10, main diffraction grating 11 and sub-diffraction grating 12 are therefore formed having the same plan shapes as those of the resist patterns 8a and 8b. After the etching, the resist patterns 8a and 8b are removed.

As shown in FIG. 1, a p-side electrode 14 is formed on the upper surface of the ridge 10 and an n-side electrode 15 is formed on the bottom surface of the substrate 1. For example, these electrodes are formed by vacuum deposition method. The plan shape of the p-side electrode 14 can be defined, for example, by lift-off method.

Figure 5:
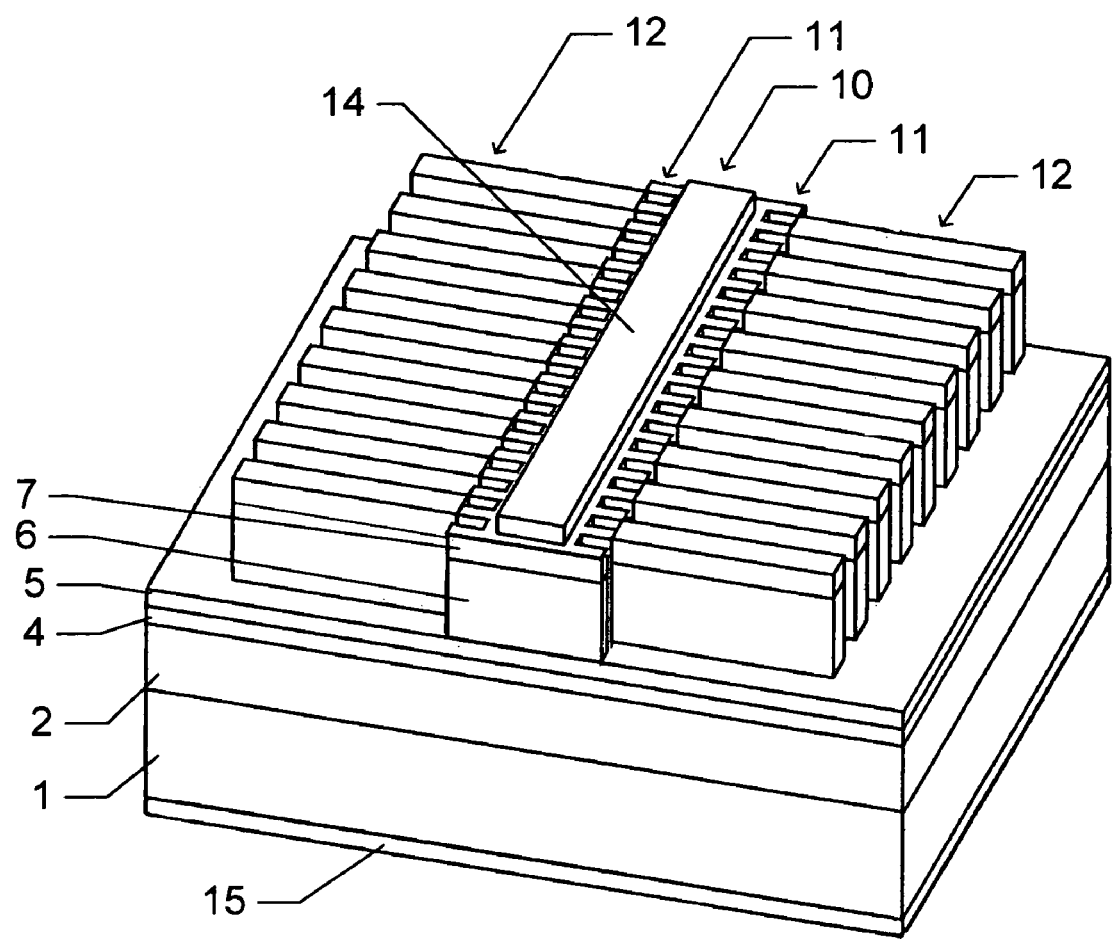
FIG. 5 is a perspective view of a ridge-waveguide DFB laser diode according to a modification of the first embodiment.

FIG. 5 is a perspective view of a ridge-waveguide DFB laser diode according to a modification of the first embodiment. In the following description, attention is paid to different points from the ridge-waveguide DFB laser diode of the first embodiment. Description is omitted for the same structures as those of the first embodiment ridge-waveguide DFB laser diode.

In the first embodiment, the lower optical guide layer 3 is disposed between the lower clad layer 2 and active layer 4. In the modification, the lower optical guide layer 3 is not disposed, and the lower clad layer 2 contacts the active layer 4. In the first embodiment, a thickness of the upper optical guide layer 5 is 0.15 μm, whereas in the modification, the thickness is 0.1 μm.

Figure 6A:
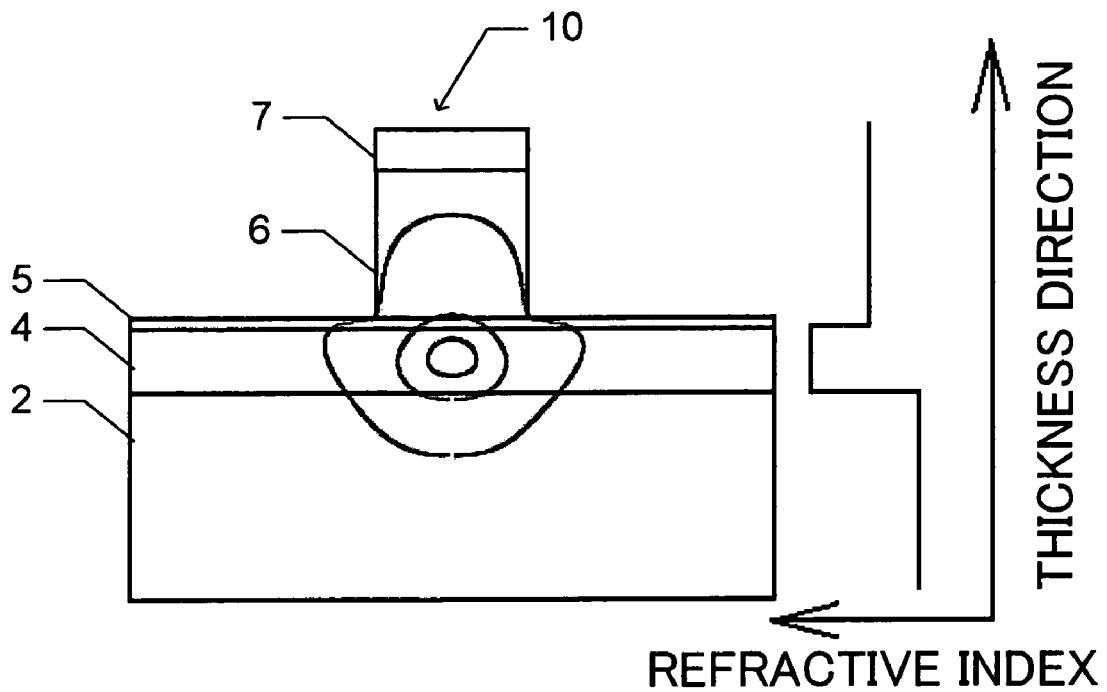
FIG. 6A is a diagram showing the intensity distribution of light of the ridge-waveguide DFB laser diode according to the modification of the first embodiment.
Figure 6B:
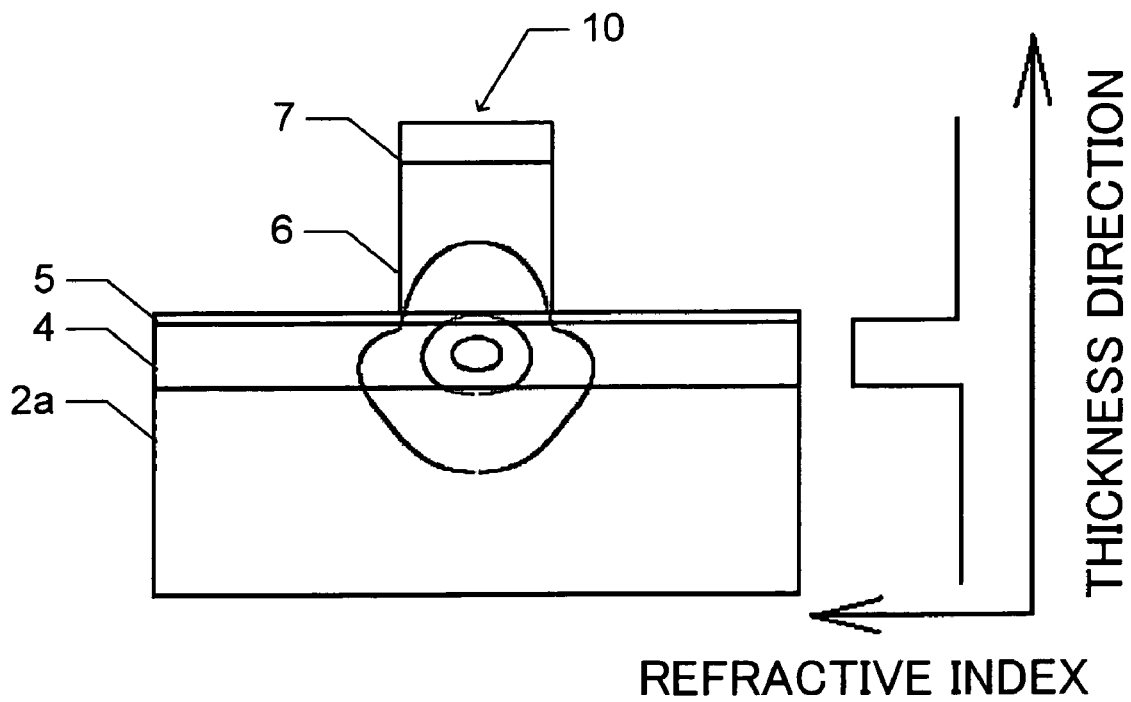
FIG. 6B is a diagram showing the intensity distribution of light of a ridge-waveguide DFB laser diode according to a comparative example.

The left side in FIG. 6A shows an example of an intensity distribution of light along a cross section perpendicular to the optical waveguide, and the right side shows the distribution of a refractive index in a thickness direction. The upper optical guide layer 5 and upper clad layer 6 are made of $Al_{0.3}Ga_{0.7}As$, and the lower clad layer 2 is made of $Al_{0.5}Ga_{0.5}As$. A refractive index of the lower clad layer 2 is therefore lower than that of the upper optical guide layer 5 and upper clad layer 6. For the comparison, FIG. 6B shows the optical intensity distribution and refractive index distribution wherein the lower clad layer 2a is made of AlGaAs having the same composition ratio as that of the upper optical guide layer 5 and upper clad layer 6.

Light has a tendency of expanding more into medium having a high refractive index than into medium having a low refractive index. Therefore, as compared to the comparative example shown in FIG. 6B, the optical intensity is higher above the active layer 4 of the modification of the first embodiment. The main diffraction grating 11 is formed on both side surfaces of the ridge 10, and the sub-diffraction grating 12 is formed on flat surfaces on both sides of the ridge 10. Both the diffraction gratings are disposed above the active layer 4. Therefore, as in the modification of the first embodiment, the coupling coefficient κ can be made large, by setting the refractive index of the medium, specifically the lower clad layer 2, disposed on the substrate side of the active layer 4, smaller than that of the media, specifically the upper optical guide layer 5 and upper clad layer 6, disposed above the active layer 4. For example, the coupling coefficient κ of the ridge-waveguide DFB laser diode of the modification of the first embodiment is about 1.3 to 1.6 times larger than that of the comparative laser diode shown in FIG. 6B. The upper optical guide layer 5 may be omitted to dispose the ridge-shaped upper clad layer 6 directly on the active layer 4.

By employing the structure according to the modification of the first embodiment, it is possible to shorten the optical resonator length L, while the normalized coupling coefficient κL defined by a product of the coupling coefficient κ and optical resonator length L is maintained constant. As the optical resonator length L is shortened, parasitic capacitance becomes small so that improvements on high speed modulation characteristics are expected. For example, the optical resonator length L of the laser diode shown in FIG. 6B is required to be set to 250 μm or longer in order to retain a sufficient normalized coupling coefficient κ. In contrast, in the case of the laser diode according to the modification of the first embodiment shown in FIG. 6A, the optical resonator length can be shortened to about 200 μm.

In the first embodiment shown in FIG. 1, the lower optical guide layer 3 made of AlGaAs having the same composition ratio as that of the upper optical guide layer 5 and upper clad layer 6 is disposed between the active layer 4 and lower clad layer 2. However, since the thickness of the lower optical guide layer 3 is at most 0.15 μm, the optical intensity distribution expands into the lower clad layer 2. Since the refractive index of the lower clad layer 2 is smaller than that of the upper optical guide layer 5 and upper clad layer 6, the same effects as those of the modification of the first embodiment shown in FIG. 5 can be expected.

The coupling coefficient κ can be raised by disposing medium having a refractive index smaller than that of the upper optical clad layer 6 constituting a portion of the ridge 10 on the substrate side, in the region where the optical intensity distribution expands toward the substrate 1 side.

In the first embodiment and its modification, although the medium on the substrate side of the active layer 4 has the n-type conductivity and the medium on the ridge 10 side has the p-type conductivity, the conductivity may be reversed, i.e., the p-type conductivity for the medium on the substrate side, and the n-type conductivity for the medium on the ridge 10 side. As the ridge 10 has the n-type conductivity which is easy to have low resistance, resistance of the laser diode can be lowered. An optical output can therefore be improved.

In the first embodiment and its modification, the GaAs substrate is used, the clad layer is made of AlGaAs, and the InGaAs/GaAs quantum dot layer is used as the active layer. These may be made of compound semiconductors other than those.

For example, in the modification of the first embodiment shown in FIG. 5, the substrate 1 and lower clad layer 2 are made of p-type InP. The active layer 4 has the structure that a quantum well layer of undoped AlGaInAs having a thickness of 6 nm and a barrier layer of undoped AlGaInAs having a thickness of 10 nm are alternately laminated ten times and this alternate lamination structure is sandwiched between guide layers of undoped AlGaInAs having a thickness of 20 nm. A composition wavelength of AlGaInAs constituting the barrier layers and guide layers is 1050 nm. The upper optical guide layer 5 and upper clad layer 6 are made of n-type GaInAsP or AlGaInAs having a composition wavelength of 950 nm, and the contact layer 7 is made of n-type GaInAs. The electrode 14 contacting the n-type contact layer is made of a laminated layer of AuGe/Au, and the electrode 15 contacting the p-type substrate 1 is made of a laminated layer of AuZn/Au. In this case, the period of the main diffraction grating 11 is set to 198 nm.

Figure 7:
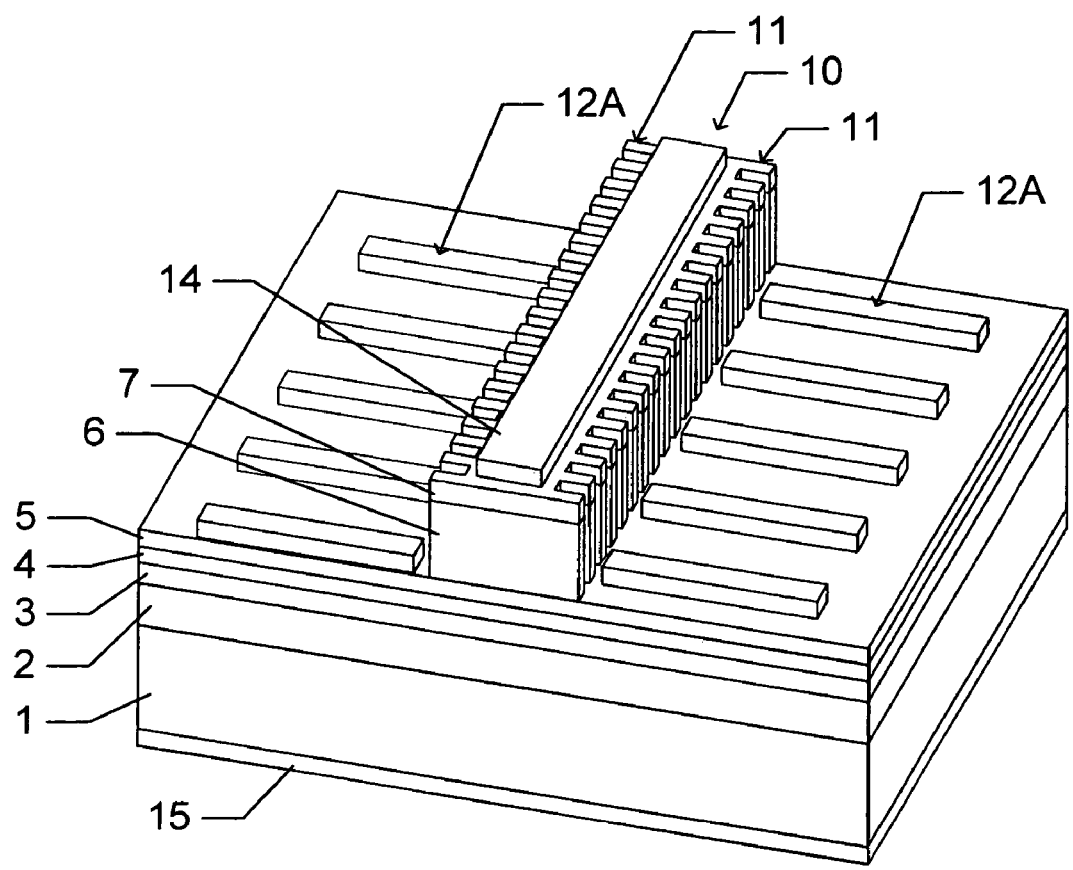
FIG. 7 is a perspective view of a ridge-waveguide DFB laser diode according to a second embodiment.

FIG. 7 is a perspective view of a ridge-waveguide DFB laser diode according to the second embodiment. As compared to the ridge-waveguide DFB laser diode of the first embodiment, the ridge-waveguide DFB laser diode of the second embodiment has the structure of the sub-diffraction grating different from that of the first embodiment, and other structures are the same.

In the first embodiment, the phases of two portions of the sub-diffraction grating 12 disposed on both sides of the ridge 10 are the same, whereas in the second embodiment, the phase of a sub-diffraction grating 12A disposed on one side of the ridge 10 is shifted by a half period of the main diffraction grating 11 from the phase of a sub-diffraction grating 12A disposed on the other side. The period of each of two portions of the sub-diffraction grating is twice as long as that of the main diffraction grating 11. A duty ratio of the convex portion to one period of the sub-diffraction grating 12A is 25%.

Although FIG. 7 shows the convex portions constituting the sub-diffraction grating 12A lower than the ridge 10, the convex portions constituting the sub-diffraction grating 12A may have the same height as that of the ridge 10, as in the case of the first embodiment.

Figure 8:
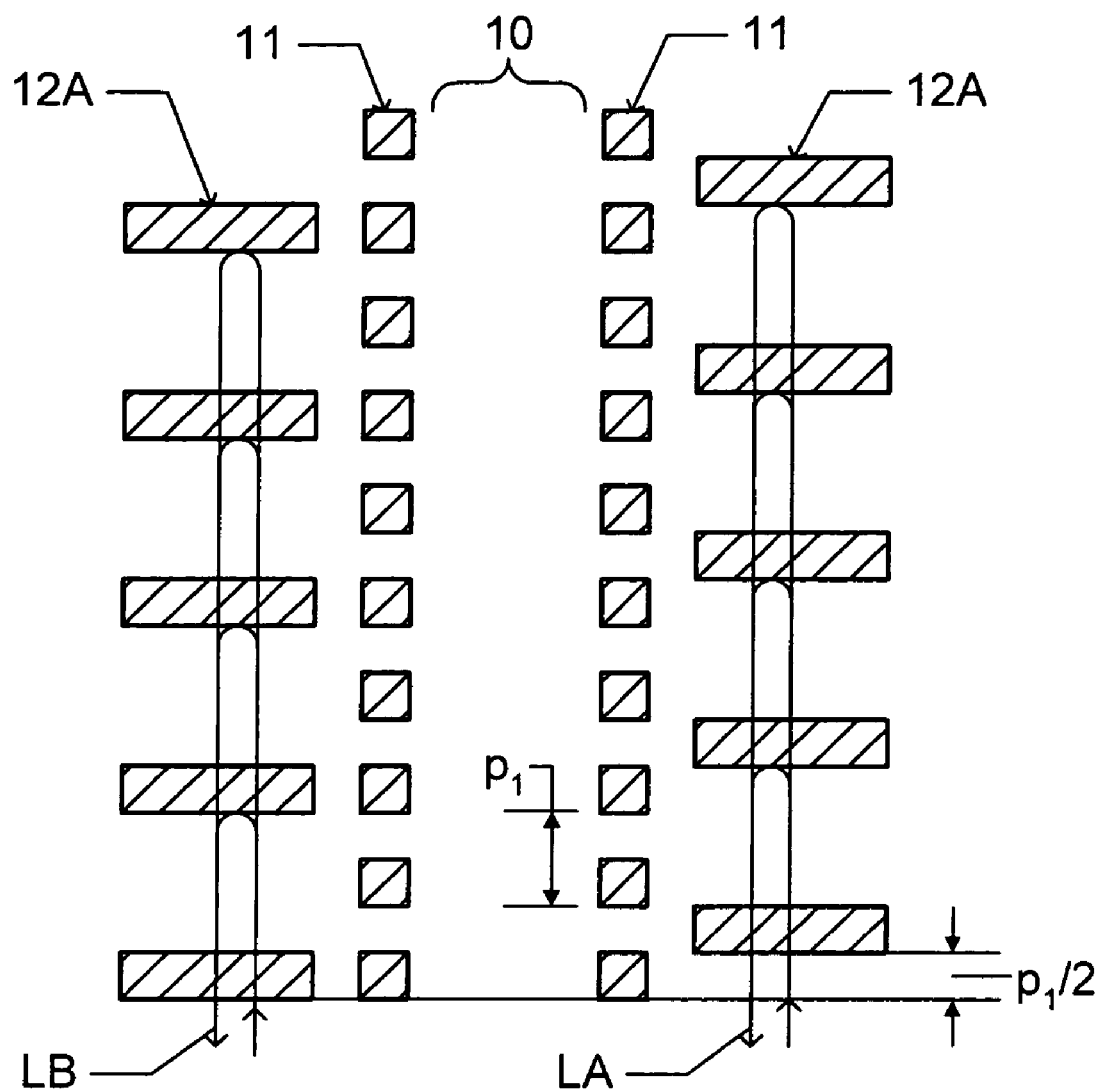
FIG. 8 is a schematic diagram showing the main diffraction grating and sub-diffraction grating of the ridge-waveguide DFB laser diode according to the second embodiment, and light propagating being coupled with the diffraction gratings.

FIG. 8 is a schematic diagram showing the phase relation between the main diffraction grating 11 and sub-diffraction grating 12A. The main diffraction grating 11 is disposed on both side surfaces of the ridge 10, and the sub-diffraction grating 12A are disposed outside the main diffraction grating 11. Hatched areas in FIG. 8 correspond to the areas having a relatively high refractive index.

A wavelength of light propagating in the optical waveguide is twice as long as the period $p_1$ of the main diffraction grating 11. Light LA diffracted by one sub-diffraction grating 12A and propagating in an opposite direction and light LB diffracted by the other sub-diffraction grating 12A and propagating in an opposite direction have a phase shift twice as large as the phase shift of two portions of the sub-diffraction grating 12A, i.e., a phase shift of the period $p_1$ of the main diffraction grating 11. This phase shift amount is equal to a half of the wavelength of light. Therefore, the light diffracted by one sub-diffraction grating 12A has a phase shift of 180° from the light diffracted by the other sub-diffraction grating 12A. The diffracted lights LA and LB dilute with each other.

Since the fundamental transverse mode of light propagating in the optical waveguide strongly couples the main diffraction grating 11 and hardly couples the sub-diffraction grating 12A, the fundamental transverse mode is hardly weakened by the sub-diffraction grating 12A. In contrast, since higher order transverse modes more strongly couple the sub-diffraction grating 12A than the fundamental transverse mode, a loss by the sub-diffraction grating 12A becomes large.

It is therefore possible to suppress oscillation of higher order transverse modes and preferentially oscillate the fundamental transverse mode.

The second embodiment utilizes a mutual phase shift of two diffraction light diffracted by the two portions of the sub-diffraction grating 12A and propagating in the optical waveguide in a propagation direction. It is therefore preferable to design the sub-diffraction grating 12A in such a manner that a diffraction intensity of light in the propagation direction becomes high. As indicated by the curve d shown in FIG. 3, the diffraction intensity of light in the propagation direction reaches its maximum value at the duty ratios of 25% and 75%. In order to increase the diffraction intensity of light in the propagation direction, it is preferable to set the duty ratio of the sub-diffraction grating in a range of 15 to 35% or in a range of 65 to 85%.

Also in the second embodiment, as in the case of the modification of the first embodiment shown in FIG. 5, the lower guide layer 3 may be omitted to directly contact the lower clad layer 2 to the active layer 4. The conductivity type of medium on the substrate side of the active layer 4 and the conductivity type of medium on the ridge side may be reversed. Also in the second embodiment, as in the case of the modification of the first embodiment, the coupling coefficient κ can be made large.

Figure 9:
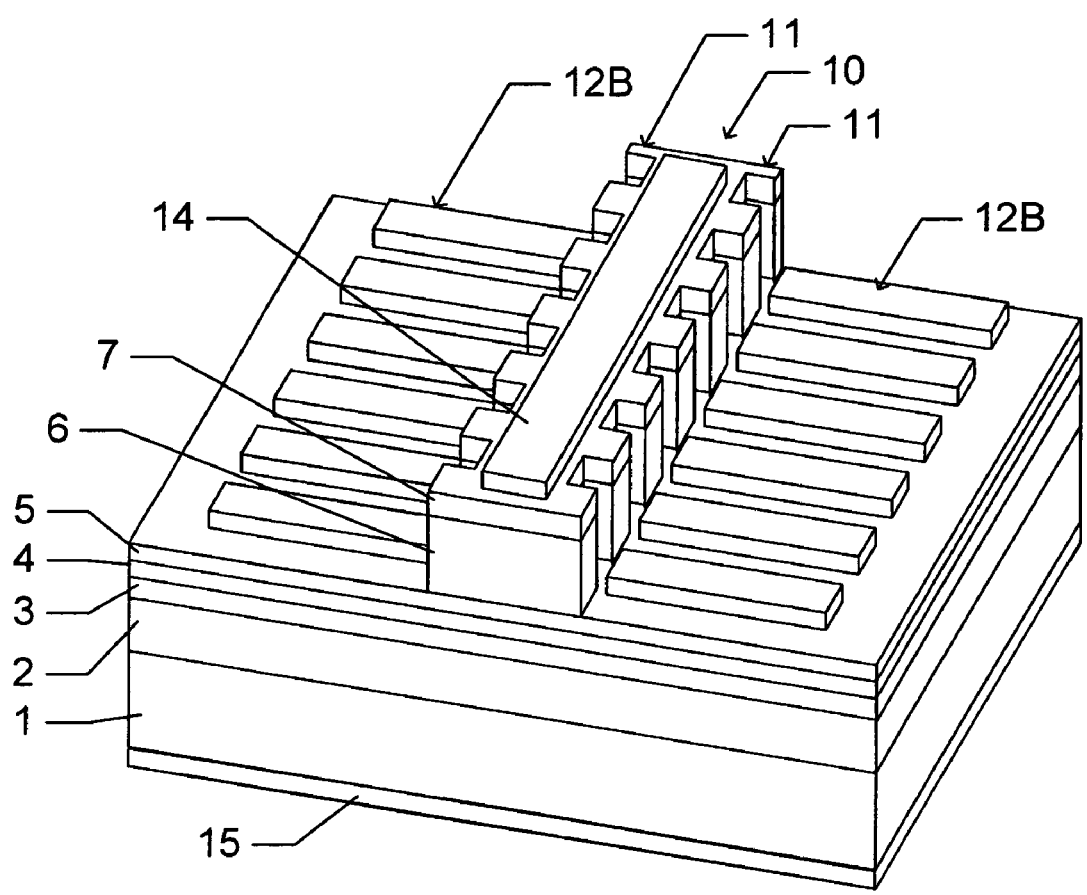
FIG. 9 is a perspective view of a ridge-waveguide DFB laser diode according to a third embodiment.

FIG. 9 is a perspective view of a ridge-waveguide DFB laser diode according to the third embodiment. As compared to the ridge-waveguide DFB laser diode of the first embodiment, the ridge-waveguide DFB laser diode of the third embodiment has the structure of the sub-diffraction grating different from that of the first embodiment, and other structures are the same.

A sub-diffraction grating 12B of the ridge-waveguide DFB laser diode according to the third embodiment has the same period as that of the main diffraction grating 11 and has a phase shift of 180° from that of the main diffraction grating 11. Although FIG. 9 shows the structure that the convex portions constituting the sub-diffraction grating 12B are lower than the ridge 10, the sub-diffraction grating 12B may have the same height as that of the ridge 10, as in the case of the first embodiment.

Figure 10:
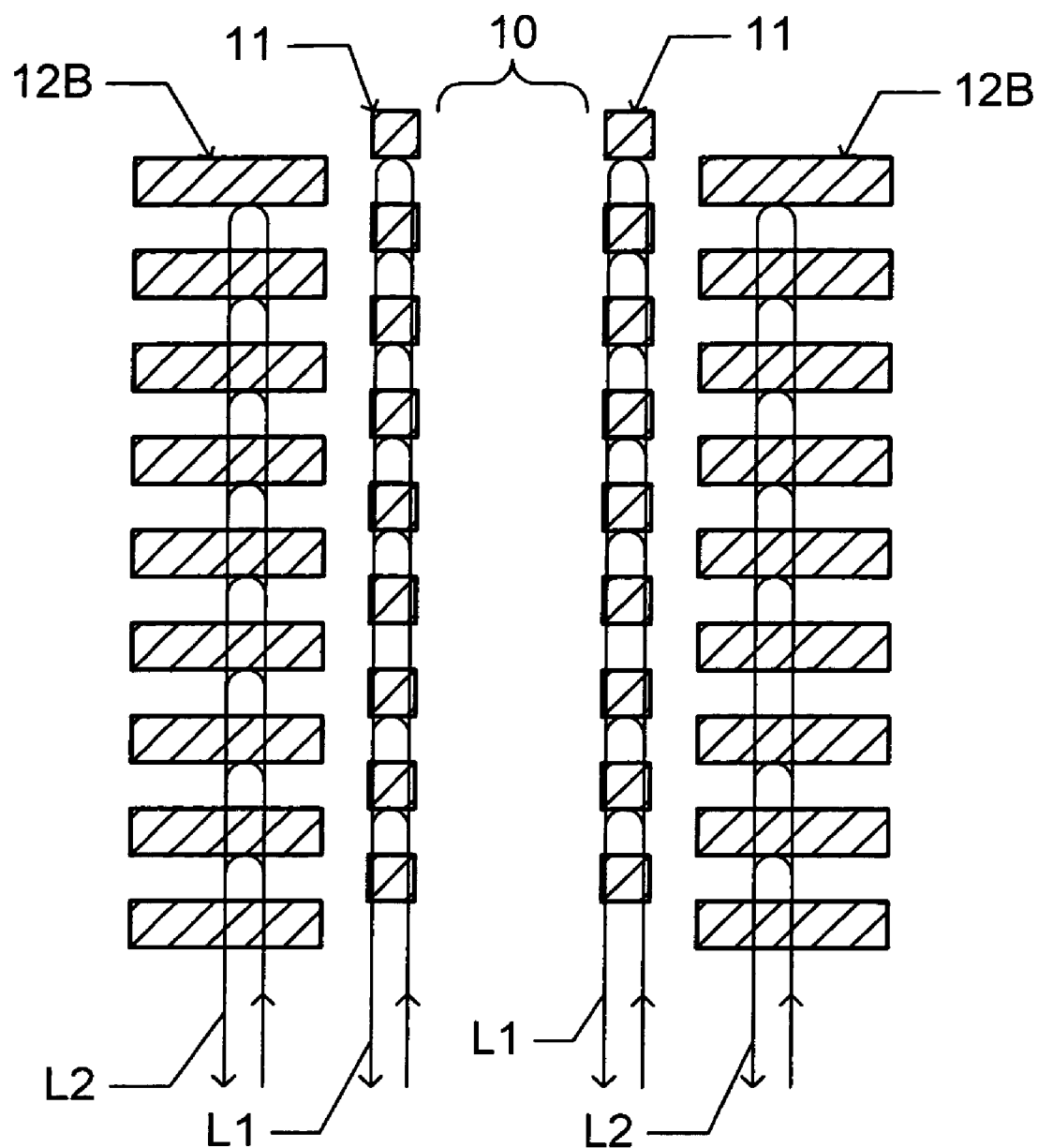
FIG. 10 is a schematic diagram showing the main diffraction grating and sub-diffraction grating of the ridge-waveguide DFB laser diode according to the third embodiment, and light propagating being coupled with the diffraction gratings.

FIG. 10 is a schematic diagram showing the phase relation between the main diffraction grating 11 and sub-diffraction grating 12B. The main diffraction grating 11 is disposed on both side surfaces of the ridge 10, and the sub-diffraction grating 12B are disposed outside the main diffraction grating 11. Hatched areas in FIG. 10 correspond to the areas having a relatively high refractive index.

Light propagating in the optical waveguide is diffracted by the main diffraction grating 11 and sub-diffraction grating 12B. Light Li diffracted by the main diffraction grating 11 has a phase shift of 180° from that of light L2 diffracted by the sub-diffraction grating 12B. The sub-diffraction grating 12B has therefore a function of weakening light coupling with the main diffraction grating 11.

Since the fundamental transverse mode of light propagating in the optical waveguide strongly couples the main diffraction grating 11 and hardly couples the sub-diffraction grating 12B, the fundamental transverse mode is hardly weakened by the sub-diffraction grating 12B. In contrast, since higher order transverse modes more strongly couple both the fundamental diffraction grating 11 and sub-diffraction grating 12B, the higher order transverse modes are weakened by the sub-diffraction grating 12B.

It is therefore possible to suppress oscillation of higher order transverse modes and preferentially oscillate the fundamental transverse mode.

Also in the third embodiment, as in the case of the modification of the first embodiment shown in FIG. 5, the lower guide layer 3 may be omitted to directly contact the lower clad layer 2 to the active layer 4. The conductivity type of medium on the substrate side of the active layer 4 and the conductivity type of medium on the ridge side may be reversed. Also in the third embodiment, as in the case of the modification of the first embodiment, the coupling coefficient κ can be made large.

Figure 11:
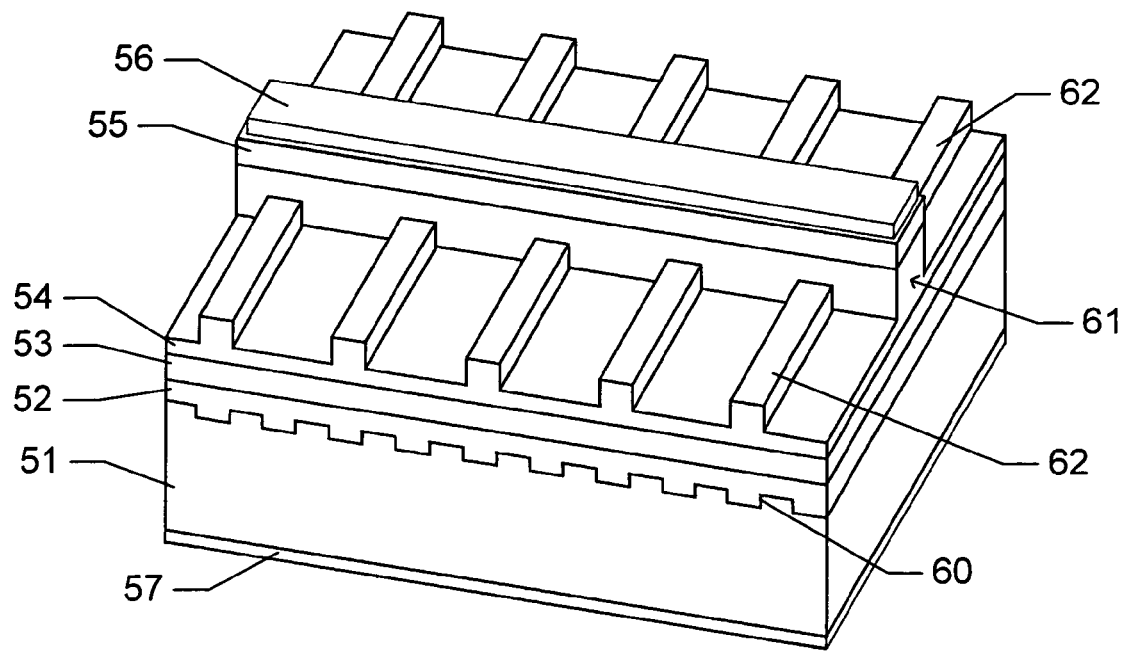
FIG. 11 is a perspective view of a ridge-waveguide DFB laser diode according to a fourth embodiment.

FIG. 11 is a perspective view of a ridge-waveguide DFB laser diode according to the fourth embodiment. A main diffraction grating 60 constituted of periodically disposed convex and concave portions is formed on the principal surface of a substrate 51 of n-type InP. An optical guide layer 52 of n-type GaInAsP having a thickness of 0.1 μm is formed on the surface of the main diffraction grating 60.

A quantum well active layer 53 is formed on the optical guide layer 52. The quantum well active layer 53 has the structure that a quantum well layer of undoped AlGaInAs having a thickness of 6 nm and a barrier layer of undoped AlGaInAs having a thickness of 10 nm are alternately laminated ten times and this alternate lamination structure is sandwiched between guide layers of undoped AlGaInAs having a thickness of 20 nm. A composition wavelength of AlGaInAs constituting the barrier layers and guide layers is 1050 nm.

An upper clad layer 54 of p-type InP is formed on the quantum well active layer 53. The upper clad layer 54 is constituted of a film-shaped portion covering the whole principal surface of the substrate, a ridge 61 extending in a first direction, and a sub-diffraction grating 62 constituted of a plurality of convex portions disposed on both sides of the ridge 61. A thickness of the film-shaped portion is 0.1 μm. A height of the ridge 61 is 1.2 μm and a width thereof is 2 μm. The convex portions constituting the sub-diffraction grating 62 are periodically disposed in a direction parallel to the direction in which the main diffraction grating 60 has periodicity.

A contact layer 55 of p-type GaInAs is formed on the ridge 61. A p-side electrode 56 is formed on the contact layer 55, and an n-side electrode 57 is formed on the bottom surface of the substrate 51.

The main diffraction grating 60 and sub-diffraction grating 62 have the periodical structure that the refractive index changes periodically in the extension direction of the ridge 61. A period of the main diffraction grating 60 is 200 nm, and a height from the bottom of the concave portion to the upper surface of the convex portion is 50 nm. A size of each concave portion in the periodicity direction is 100 nm. Namely, a distance between adjacent concave portions is also 100 nm and a duty ratio is 50%.

A period of the sub-diffraction grating 62 is 400 nm, a height of each convex portion is 100 nm, and a size of each convex portion in the periodicity direction is 100 nm. Namely, a duty ratio of the sub-diffraction grating 62 is 25%. The duty ratio may be set in the range of 15 to 35% or in the range of 65 to 85%. The periodical structure of the sub-diffraction grating 62 disposed on one side of the ridge 61 and the periodical structure of the sub-diffraction grating 62 disposed on the other side have a phase shift of 100 nm, i.e., a half period shift of the main diffraction grating 60.

A region of the quantum well active layer 53 under the ridge 61 constitutes an optical waveguide for propagating light in a longitudinal direction of the ridge 61. The main diffraction grating 60 is disposed over the whole width direction of the optical waveguide. The sub-diffraction grating 62 is disposed only outside the optical waveguide and is not disposed in the region with which the sub-diffraction grating 62 overlaps in the width direction of the optical waveguide. Therefore, the fundamental transverse mode of light propagating in the optical waveguide strongly couples the main diffraction grating 60 and hardly couples the sub-diffraction grating 62. In contrast, higher order transverse modes couple the main diffraction grating 60 and more strongly couple the sub-diffraction grating 62 than the fundamental transverse mode.

Therefore, as in the case of the sub-diffraction grating 12A of the ridge-waveguide DFB laser diode according to the second embodiment shown in FIGS. 7 and 8, the sub-diffraction grating 62 of the ridge-waveguide DFB laser diode according to the fourth embodiment increases the propagation loss in higher order transverse modes. It is therefore possible to suppress oscillation of higher order transverse modes.

Next, with reference to FIGS. 12A to 12E, description will be made on a manufacture method for the ridge-waveguide DFB laser diode of the fourth embodiment.

Figure 12A:
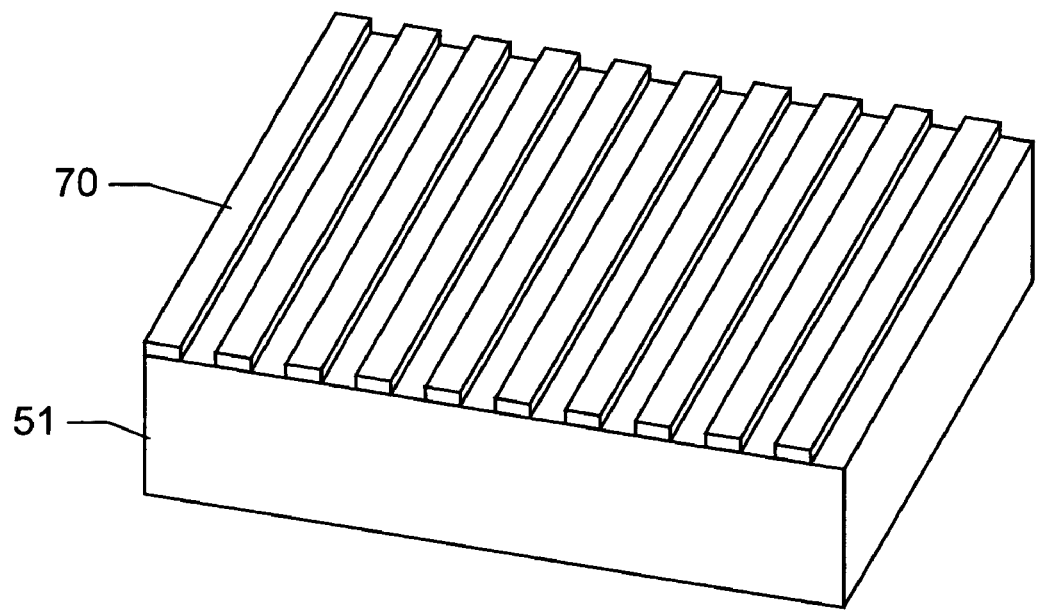
FIGS. 12A to 12E are perspective views illustrating the ridge-waveguide DFB laser diode during manufacture of the fourth embodiment.

As shown in FIG. 12A, a resist pattern 70 is formed on the principal surface of a substrate 51 of n-type InP, by interference exposure or electron beam exposure. The resist pattern 70 corresponds to the periodical structure of the main diffraction grating 60. By using the resist pattern 70 as a mask, a surface layer of the substrate 51 is dry-etched. After etching, the resist pattern 70 is removed.

Figure 12B:
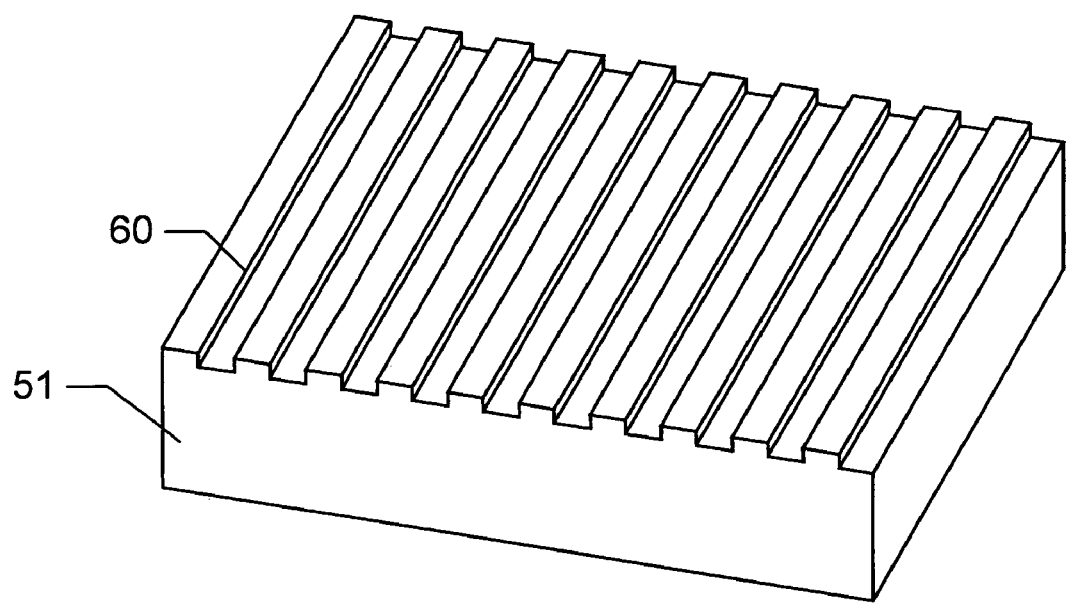

FIG. 12B shows the substrate 51 after the resist pattern 70 is removed. The main diffraction grating 60 is constituted of concave portions in the regions not covered with the resist pattern 70 and convex portions left between concave portions.

Figure 12C:
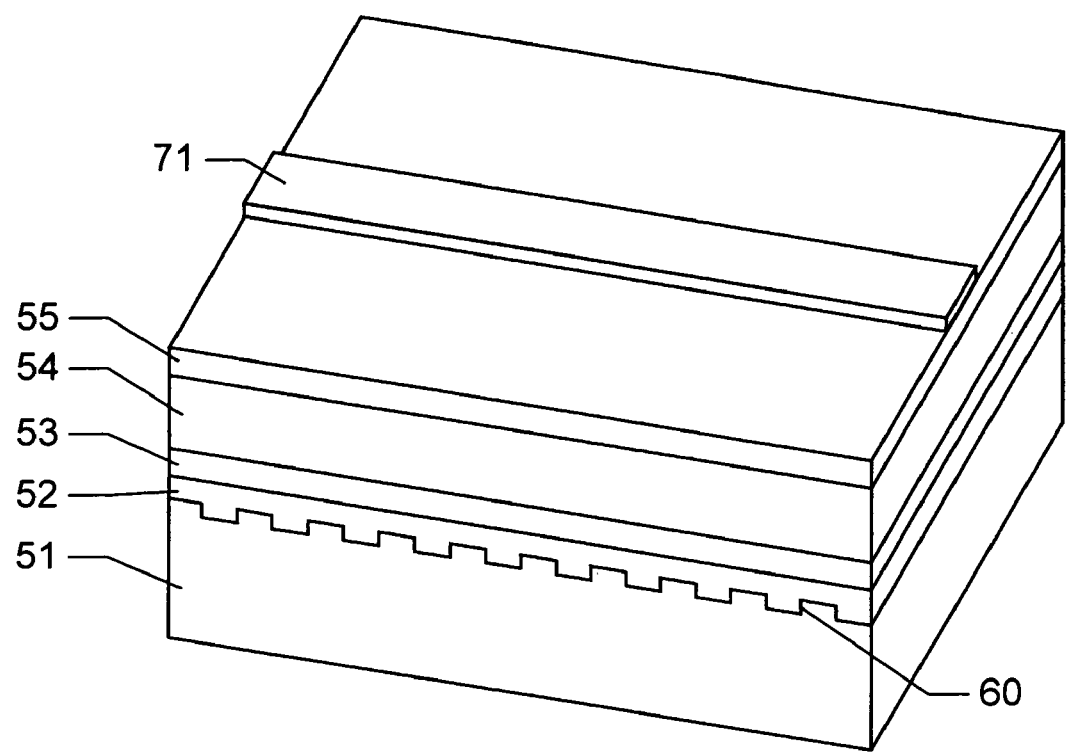

As shown in FIG. 12C, an optical guide layer 52 of n-type GaInAsP, a quantum well active layer 53, an upper clad layer 54 of p-type InP and a contact layer 55 of p-type GaInAs are grown on the principal surface of the substrate 51 formed with the main diffraction grating 60, for example, by metal organic vapor deposition (MOVPD). A mask pattern 71 of silicon oxide corresponding to the ridge 61 shown in FIG. 11 is formed on the contact layer 55.

Figure 12D:
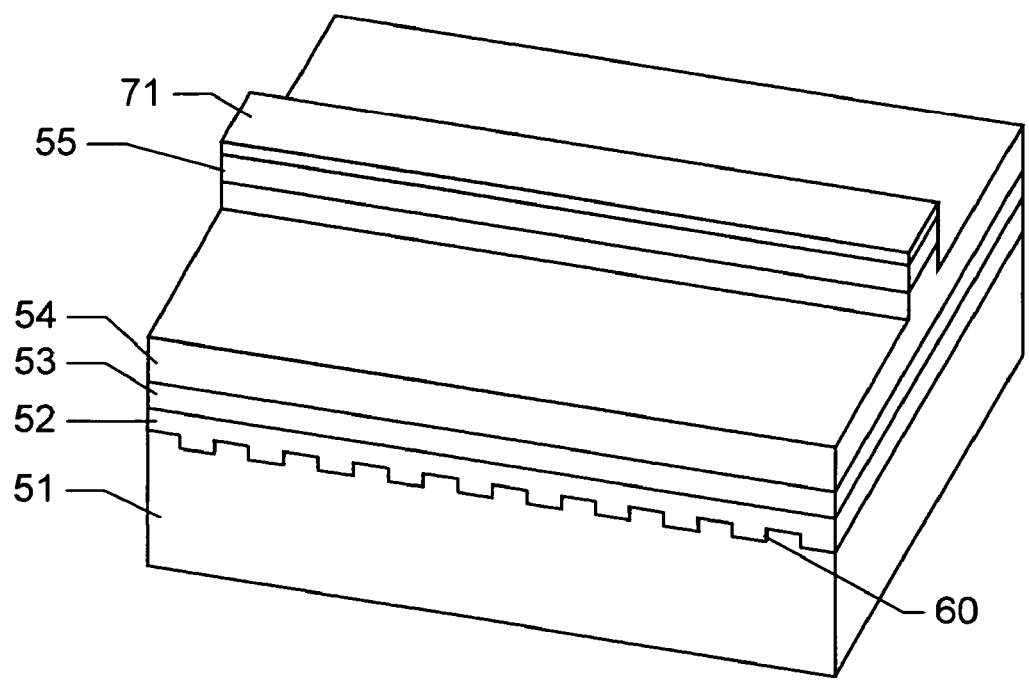

As shown in FIG. 12D, by using the mask pattern 71 as a mask, the contact layer 55 is dry-etched and the upper clad layer 54 is dry-etched to some depth.

Figure 12E:
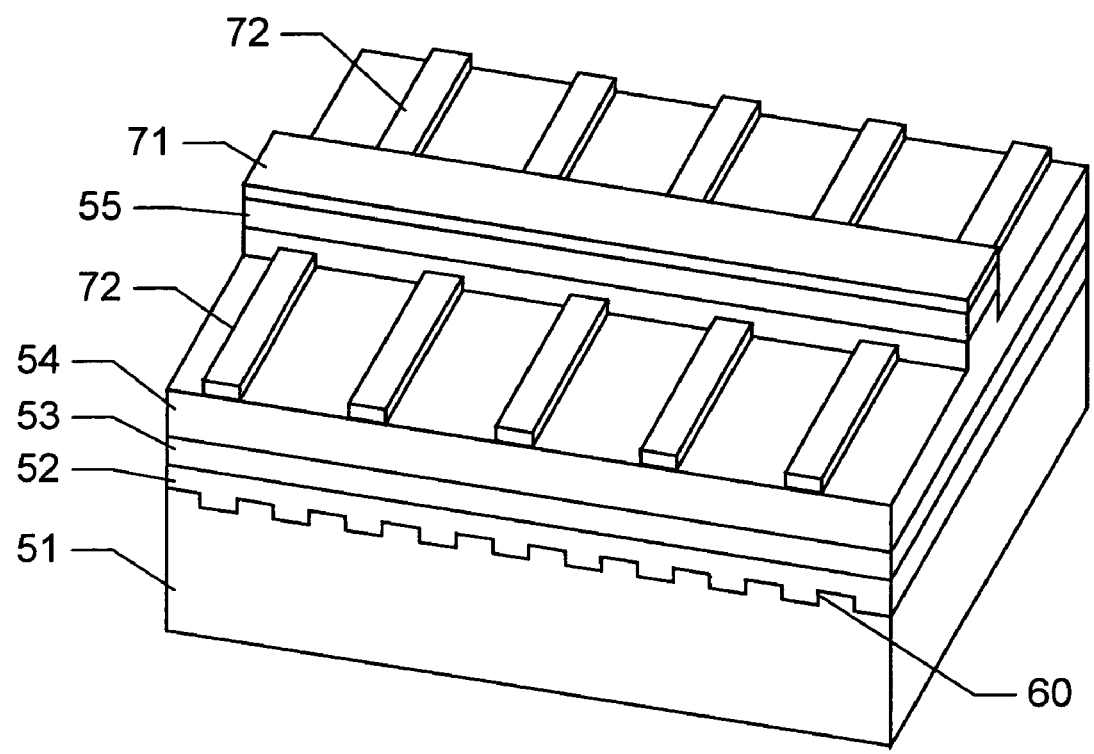

As shown in FIG. 12E, a resist pattern 72 is formed on flat surfaces on both sides of the mask pattern 71 by electron beam exposure, the resist pattern 72 corresponding to the convex portions constituting the sub-diffraction grating 62 shown in FIG. 11. By using the mask pattern 71 and resist pattern 72 as a mask, the upper clad layer 54 is dry-etched to some depth. After the upper clad layer 54 is etched to some depth, the resist pattern 72 and mask pattern 71 are removed.

The ridge 61 and sub-diffraction grating 62 are therefore formed as shown in FIG. 11. A p-side electrode 56 is formed on the contact layer 55 by lift-off method. An n-side electrode 57 is formed on the bottom surface of the substrate 51.

Figure 13:
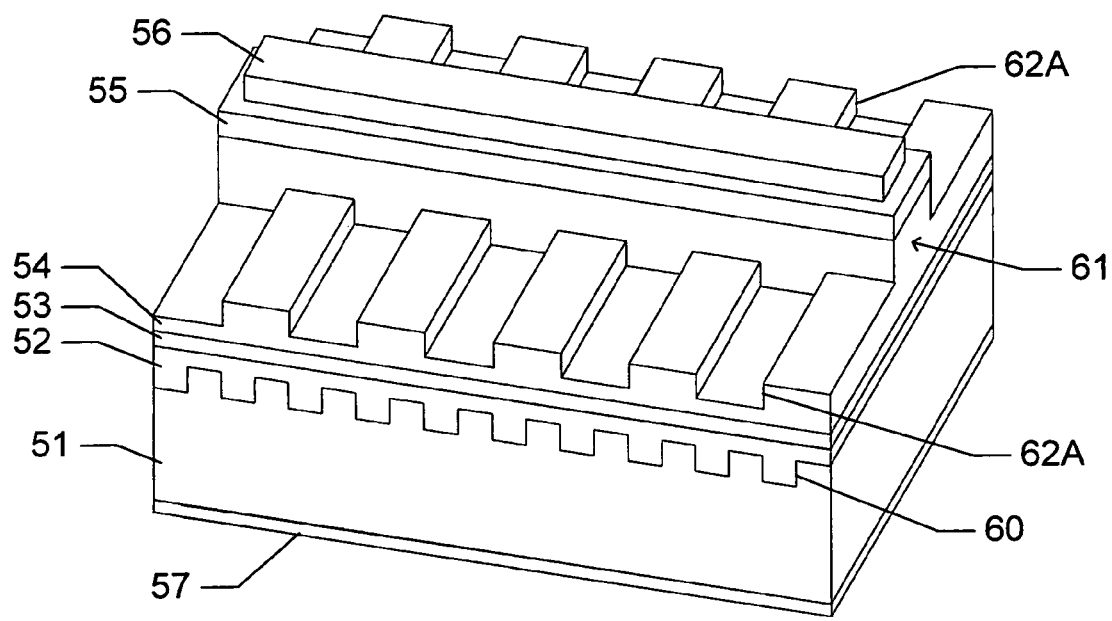
FIG. 13 is a perspective view of a ridge-waveguide DFB laser diode according to a fifth embodiment.

FIG. 13 is a perspective view of a ridge-waveguide DFB laser diode according to the fifth embodiment. As compared to the ridge-waveguide DFB laser diode of the fourth embodiment, the ridge-waveguide DFB laser diode of the fifth embodiment has the structure of the sub-diffraction grating different from that of the fourth embodiment, and other structures are the same.

In the fifth embodiment, the phases of two portions of a sub-diffraction grating 62A disposed on both sides of a ridge 61 are matched. A period of the sub-diffraction grating 62A is 400 nm, a height of each convex portion constituting the sub-diffraction grating 62A is 100 nm, and a size of each convex portion in an extension direction of the ridge 61 is 200 nm. Namely, a duty ratio of the sub-diffraction grating 62A is 50%. The duty ratio may be set in the range of 35 to 65%.

As in the case of the sub-diffraction grating 12 of the ridge-waveguide DFB laser diode according to the first embodiment shown in FIGS. 1 to 3, the sub-diffraction grating 62A of the ridge-waveguide DFB laser diode according to the fifth embodiment increases a propagation loss in higher order transverse modes. It is therefore possible to suppress oscillation of higher order transverse modes.

Figure 14:
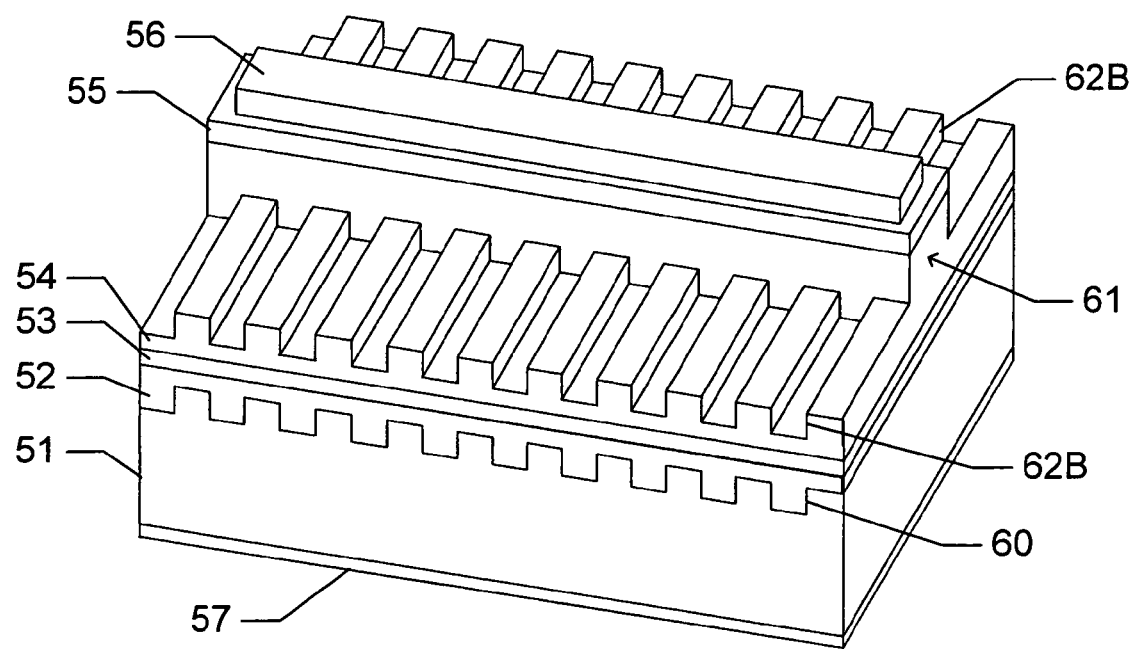
FIG. 14 is a perspective view of a ridge-waveguide DFB laser diode according to a sixth embodiment.

FIG. 14 is a perspective view of a ridge-waveguide DFB laser diode according to the sixth embodiment. As compared to the ridge-waveguide DFB laser diode of the fourth embodiment, the ridge-waveguide DFB laser diode of the sixth embodiment has the structure of the sub-diffraction grating different from that of the fourth embodiment, and other structures are the same.

In the sixth embodiment, the phases of two portions of a sub-diffraction grating 62B disposed on both sides of a ridge 61 are matched. A period of the sub-diffraction grating 62B is 200 nm, a height of each convex portion constituting the sub-diffraction grating 62B is 100 nm, and a size of each convex portion in an extension direction of the ridge 61 is 100 nm. Namely, a duty ratio of the sub-diffraction grating 62B is 50%. As compared to the main diffraction grating 60, the periodical structure of a refractive index of the sub-diffraction grating 62B is shifted by a half period, i.e., 100 nm.

As in the case of the ridge-waveguide DFB laser diode 12B of the third embodiment shown in FIGS. 9 and 10, the sub-diffraction grating 62B of the ridge-waveguide DFB laser diode of the sixth embodiment can increase a propagation loss in higher order transverse modes. It is therefore possible to suppress oscillation of higher order transverse modes.

Figure 15:
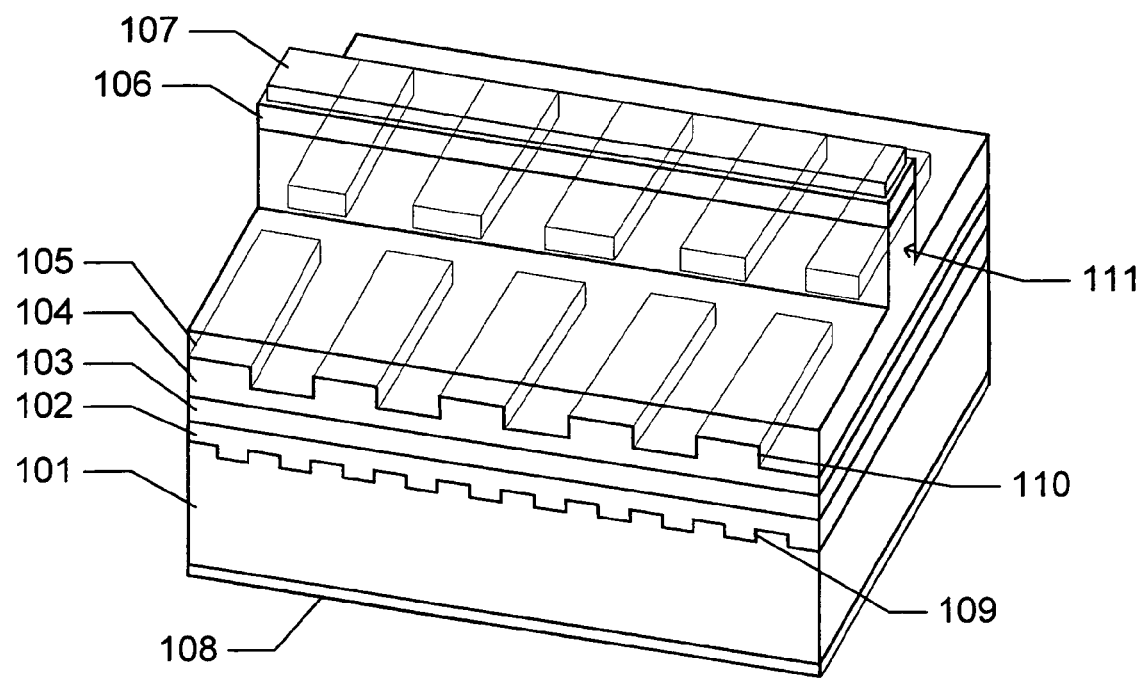
FIG. 15 is a perspective view of a ridge-waveguide DFB laser diode according to a seventh embodiment.

FIG. 15 is a perspective view of a ridge-waveguide DFB laser diode according to the seventh embodiment. A main diffraction grating 109 is formed on the principal surface of a substrate 101 of n-type InP. An optical guide layer 102 of n-type GaInAsP having a thickness of 0.1 μm is formed on the principal surface of the substrate 101 formed with the main diffraction grating 109. A quantum well active layer 103 is formed on the optical guide layer 102. The quantum well active layer 103 has the same structure as that of the quantum well layer 53 of the ridge-waveguide DFB laser diode of the fourth embodiment shown in FIG. 11.

An upper clad layer 104 of p-type GaInAsP having a thickness of 0.1 μm is formed on the quantum well active layer 103. Sub-diffraction grating 110 is formed on the upper surface of the upper optical guide layer 104. An upper clad layer 105 of p-type InP is formed on the sub-diffraction grating 110. The upper clad layer 105 is constituted of a film-shaped portion covering the whole substrate surface and a ridge 111 formed thereon and extending along one direction. A thickness of the film-shaped portion is 0.1 μm, and a height of the ridge 111 is 1.2 μm and a width thereof is 2 μm.

A contact layer 106 of p-type GaInAs is formed on the ridge 111. A p-side electrode 107 is formed on the contact layer 106, and an n-side electrode 108 is formed on the bottom surface of the substrate 101.

The main diffraction grating 109 and sub-diffraction grating 110 have the periodical structure that the refractive index changes periodically in the extension direction of the ridge 111. The main diffraction grating 109 is disposed just under the ridge 111 and in areas on both sides of the ridge 111. The sub-diffraction grating 110 is disposed in areas on both sides of the ridge 111 but not disposed just under the ridge 111.

A period of the main diffraction grating 109 is 200 nm, and a height from the bottom of the concave portion constituting the main diffraction grating 109 to the upper surface of the convex portion is 50 nm. A duty ratio is 50%. A period of the sub-diffraction grating 110 is 400 nm, a height of each convex portion constituting the sub-diffraction grating 110 is 100 nm, and a size thereof in the extension direction of the ridge 111 is 200 nm. Namely, a duty ratio is 50%. The duty ratio of the sub-diffraction grating 110 may be set in the range of 35% to 65%.

A quantum well active layer 103 under the ridge 111 functions as the optical waveguide for propagating light in the extension direction of the ridge 111. Since the main diffraction grating 109 is disposed just under the ridge 111, the fundamental transverse mode of light propagating in the optical waveguide strongly couples the main diffraction grating 109. Since the sub-diffraction grating 110 is not disposed just under the ridge 111, the fundamental transverse mode weakly couples the sub-diffraction gratings 110. Higher order transverse modes strongly couple both the main diffraction grating 109 and sub-diffraction gratings 110.

Therefore, as in the case of the sub-diffraction grating 12 of the ridge-waveguide DFB laser diode according to the first embodiment shown in FIGS. 1 to 3, the sub-diffraction grating 110 of the ridge-waveguide DFB laser diode according to the seventh embodiment increase the propagation loss in higher order transverse modes. It is therefore possible to suppress oscillation of higher order transverse modes.

Next, with reference to FIGS. 16A to 16E, description will be made on a manufacture method for the ridge-waveguide DFB laser diode of the seventh embodiment.

Figure 16A:
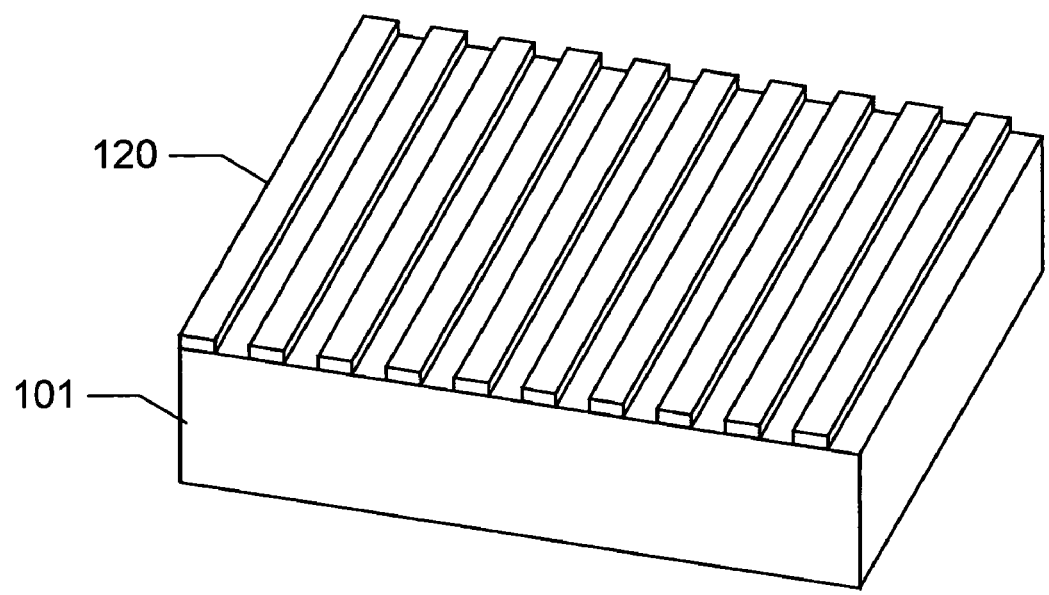
FIGS. 16A to 16E are perspective views illustrating the ridge-waveguide DFB laser diode during manufacture of the seventh embodiment.

As shown in FIG. 16A, a resist pattern 120 is formed on the principal surface of a substrate 101 of n-type InP, by interference exposure or electron beam exposure. The resist pattern 120 has a plan shape corresponding to the convex portions constituting the main diffraction grating 109 shown in FIG. 15. By using the resist pattern 120 as a mask, a surface layer of the substrate 101 is dry-etched. After etching, the resist pattern 120 is removed.

Figure 16B:
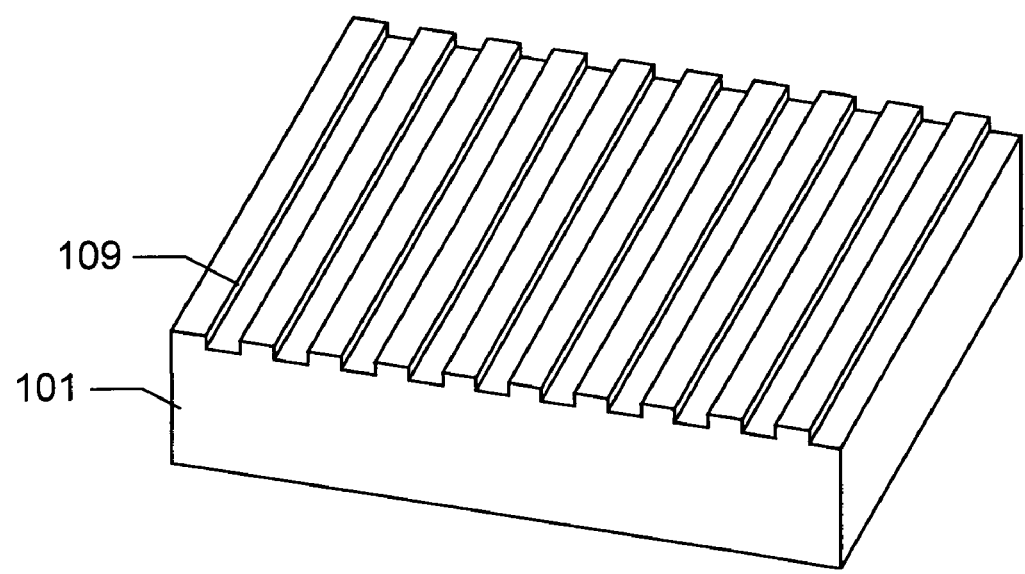

As shown in FIG. 16B, a main diffraction grating 109 is therefore formed on the principal surface of the substrate 101, the main diffraction grating being constituted of concave portions in the regions not covered with the resist pattern 120 and convex portions left between concave portions.

Figure 16C:
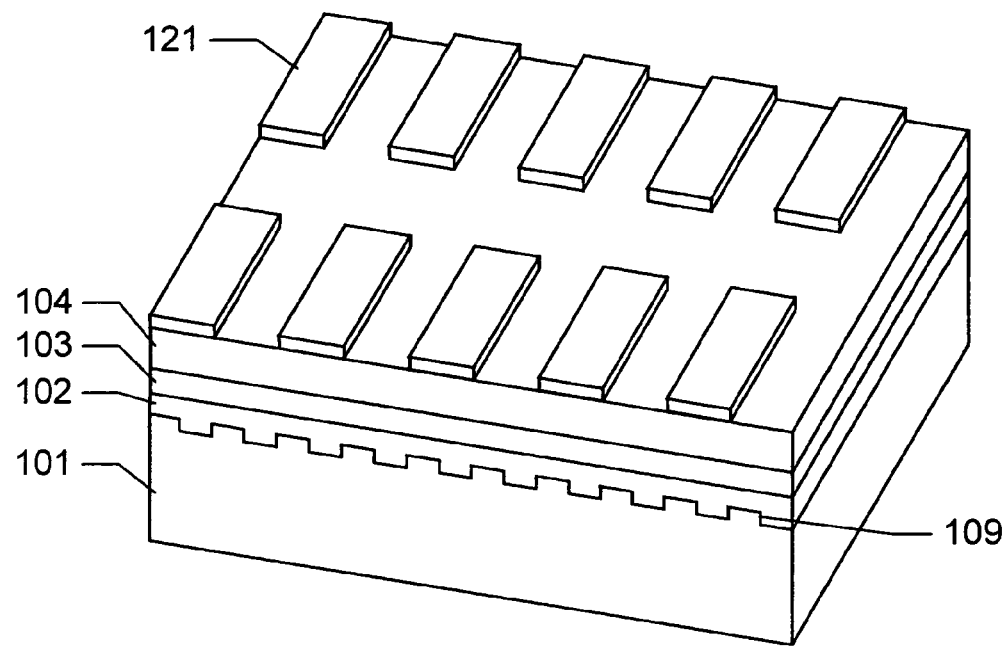

As shown in FIG. 16C, a lower optical guide layer 102 of n-type GaInAsP, a quantum well active layer 103, an upper optical guide layer 104 of p-type GaInAsP are sequentially grown on the principal surface of the substrate 101 formed with the main diffraction grating 109, for example, by MOVPE. A resist pattern 121 having a plan shape corresponding to the convex portions constituting the sub-diffraction grating 110 shown in FIG. 15 is formed on the upper optical guide layer 104. The resist pattern 121 can be formed by a combination of interference exposure or electron beam exposure and usual ultraviolet exposure. By using the resist pattern 121 as a mask, a surface layer of the upper optical guide layer 104 is etched. After etching, the resist pattern 121 is removed.

Figure 16D:
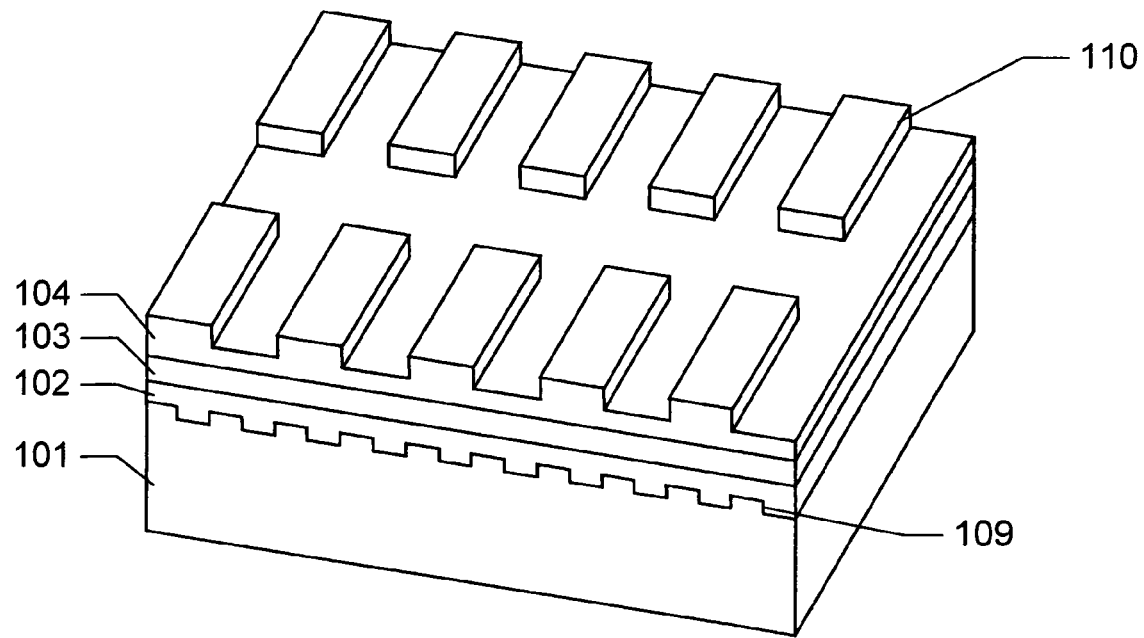

As shown in FIG. 16D, the sub-diffraction grating 110 is therefore formed on the surface of the upper optical guide layer 104.

Figure 16E:
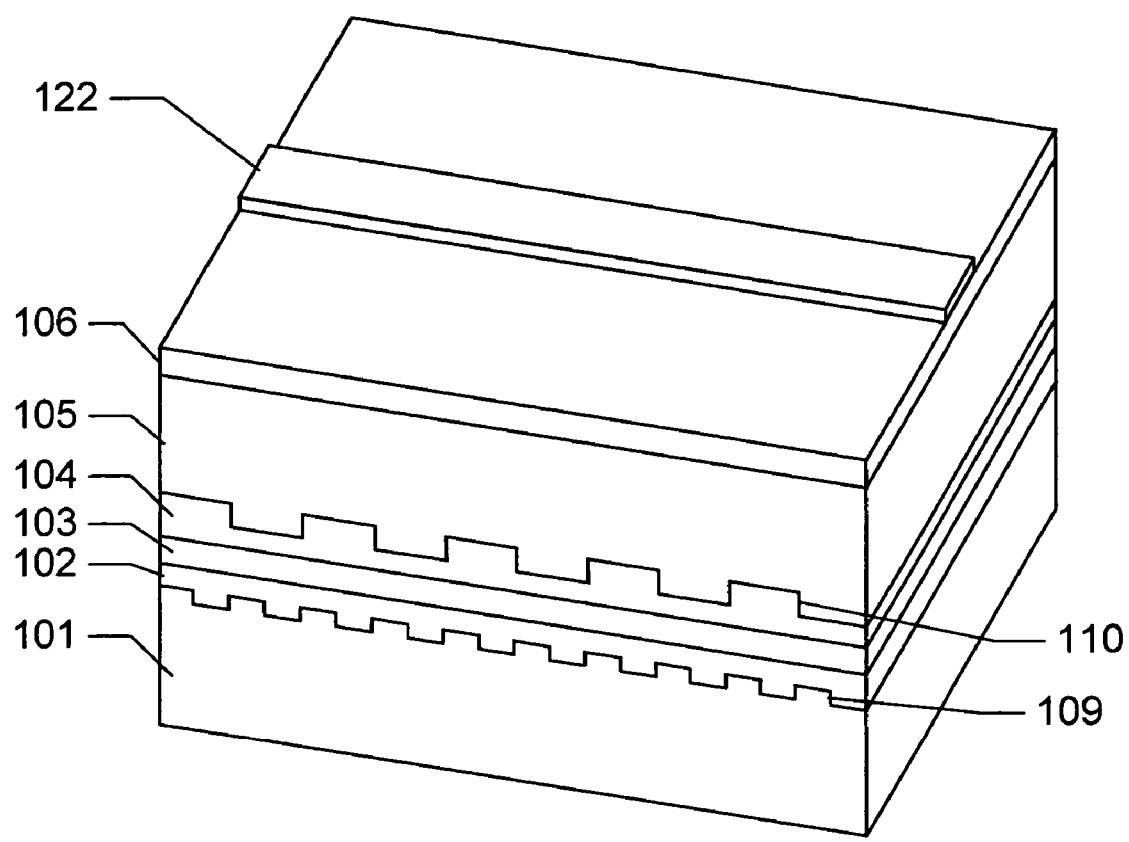

As shown in FIG. 16E, an upper clad layer 105 of p-type InP and a contact layer 106 of p-type GaInAs are grown on the surface of the upper optical guide layer 104 formed with the sub-diffraction grating 110, by MOVPE. A mask pattern 122 of silicon oxide is formed on the contact layer 106. The mask pattern 122 has a plan shape corresponding to the ridge 111 shown in FIG. 15.

By using the mask pattern 122 as a mask, the contact layer 106 is dry-etched and the upper clad layer 105 is etched to some depth. After etching, the mask pattern 122 is removed.

The ridge 111 is therefore formed and the contact layer 106 is left thereon as shown in FIG. 15. A p-side electrode 107 is formed on the contact layer 106 by lift-off method, and an n-side electrode 108 is formed on the bottom surface of the substrate 101.

Figure 17:
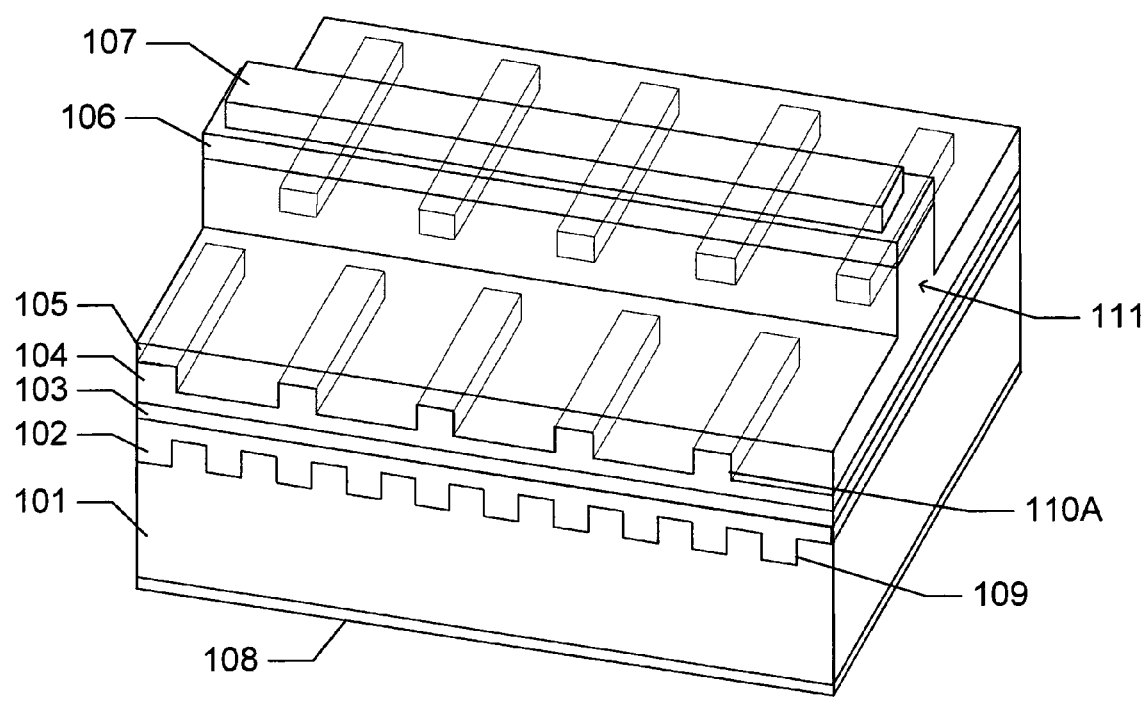
FIG. 17 is a perspective view of a ridge-waveguide DFB laser diode according to an eighth embodiment.

FIG. 17 is a perspective view of a ridge-waveguide DFB laser diode according to the eighth embodiment. As compared to the ridge-waveguide DFB laser diode of the seventh embodiment, the ridge-waveguide DFB laser diode of the eighth embodiment has the structure of the sub-diffraction grating different from that of the seventh embodiment, and other structures are the same.

In the eighth embodiment, periods of two portions of a sub-diffraction grating 110A disposed on both sides of the ridge 111 are 400 nm and a duty ratio is 25%. The duty ratio may be set in the range of 15 to 35% or in the range of 65 to 85%. The phases of two portions of the sub-diffraction grating 110A are shifted by a half period of the main diffraction grating 109, i.e., by 100 nm.

As in the case of the sub-diffraction grating 12A of the ridge-waveguide DFB laser diode according to the second embodiment shown in FIGS. 7 and 8, the sub-diffraction grating 110A of the ridge-waveguide DFB laser diode according to the eighth embodiment increases a propagation loss in higher order transverse modes. It is therefore possible to suppress oscillation of higher order transverse modes.

Figure 18:
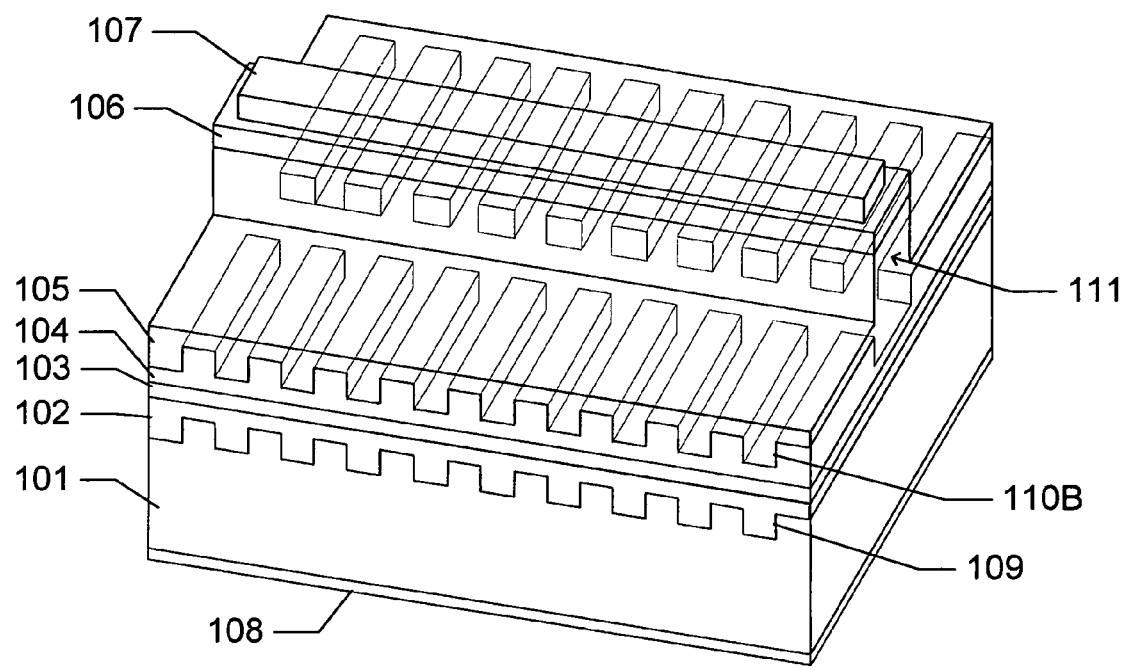
FIG. 18 is a perspective view of a ridge-waveguide DFB laser diode according to a ninth embodiment.

FIG. 18 is a perspective view of a ridge-waveguide DFB laser diode according to the ninth embodiment. As compared to the ridge-waveguide DFB laser diode of the seventh embodiment, the ridge-waveguide DFB laser diode of the ninth embodiment has the structure of the sub-diffraction grating different from that of the seventh embodiment, and other structures are the same.

In the ninth embodiment, periods of two portions of a sub-diffraction grating 110B disposed on both sides of the ridge 111 are 200 nm and a duty ratio is 50%. The refractive index distribution of the sub-diffraction grating 110B is shifted relative to the main diffraction grating 109 by a half period, i.e., by 100 nm.

As in the case of the sub-diffraction grating 12B of the ridge-waveguide DFB laser diode according to the third embodiment shown in FIGS. 9 and 10, the sub-diffraction grating 110B of the ridge-waveguide DFB laser diode according to the ninth embodiment increases a propagation loss in higher order transverse modes. It is therefore possible to suppress oscillation of higher order transverse modes.

In the seventh to ninth embodiments, the main diffraction grating 109, quantum dot active layer 103, and sub-diffraction grating 110 are disposed in this order from the substrate side. These three constituent elements may be disposed in a different order. For example, the sub-diffraction grating, quantum well active layer and main diffraction grating may be disposed in this order, both the main diffraction grating and sub-diffraction grating may be disposed on the substrate side of the quantum well active layer, or both the main diffraction grating and sub-diffraction grating may be disposed above the quantum well active layer.

Next, with reference to FIGS. 19A to 19F, description will be made on a manufacture method for a buried-heterostructure laser diode of the tenth embodiment.

Figure 19A:
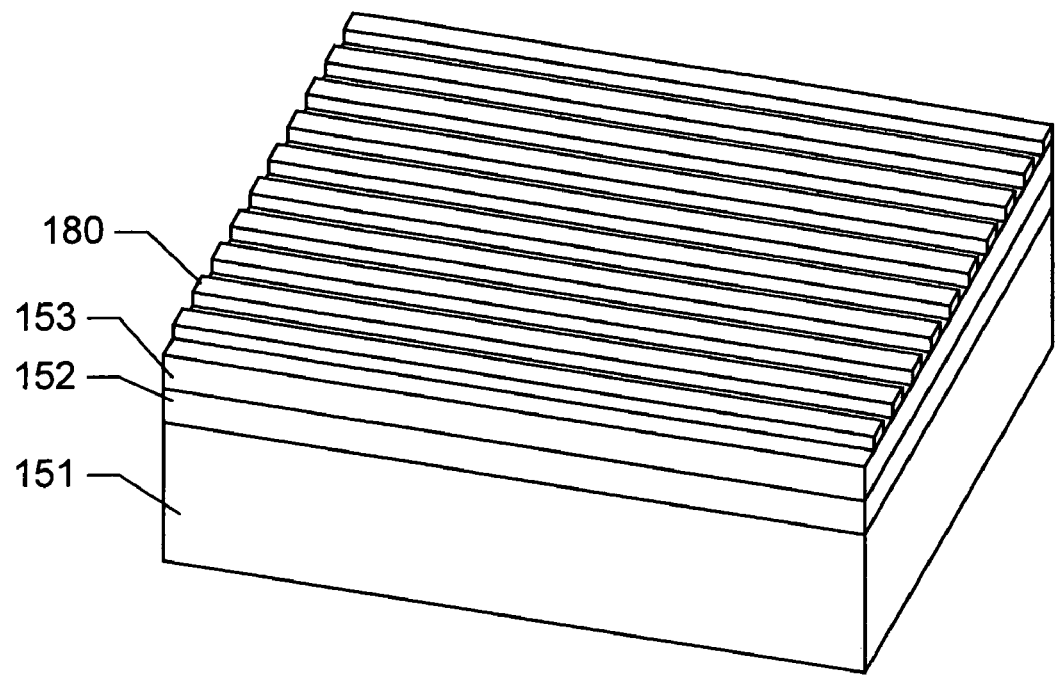
FIGS. 19A to 19E are perspective views illustrating a buried-heterostructure laser diode during manufacture according to a tenth embodiment.

As shown in FIG. 19A, a quantum well active layer 152 is formed on the principal surface of a substrate 151 of p-type InP. The quantum well active layer 152 has the same structure as that of the quantum well active layer 53 of the ridge-waveguide DFB laser diode of the fourth embodiment shown in FIG. 11. An upper optical guide layer 153 of p-type GaInAsP having a thickness of 0.1 μm is formed on the quantum well active layer 152 by MOVPE. A resist pattern 180 for forming a main diffraction grating is formed on the upper optical guide layer 153, by interference exposure or electron beam exposure. The resist pattern 180 has a stripe plan shape that a plurality of band-shaped patterns having a width of 100 nm are disposed at an regular intervals of 100 nm.

By using the resist pattern 180 as a mask, a surface layer of the upper optical guide layer 153 is etched. After etching, the resist pattern 180 is removed.

Figure 19B:
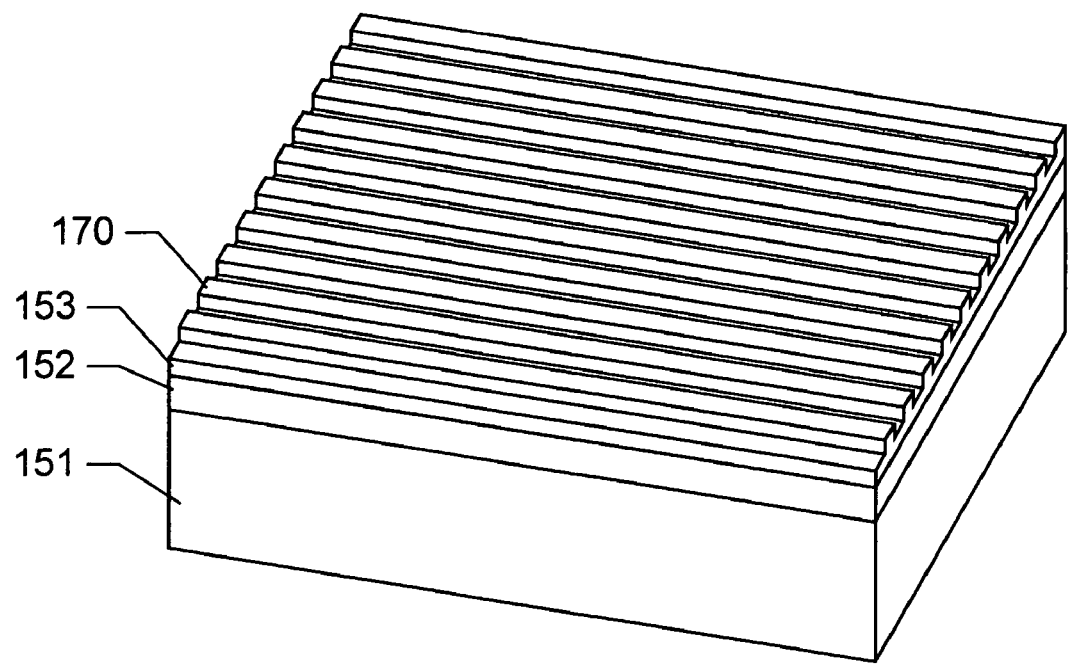

As shown in FIG. 19B, the main diffraction grating 170 is therefore formed on the surface of the upper optical guide layer 153, the main diffraction grating 170 being constituted of concave portions having a depth of 50 nm and formed in the regions not covered with the resist pattern 180 and convex portions left between concave portions. A period of the main diffraction grating 170 is 200 nm and its duty ratio is 50%.

Figure 19C:
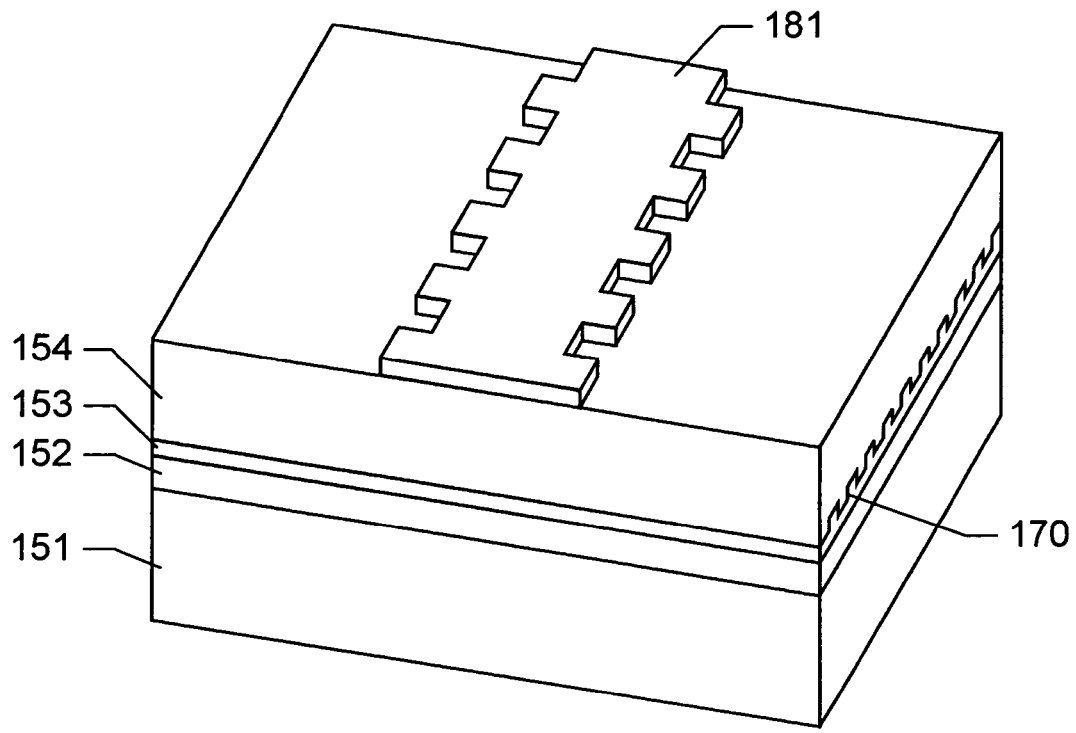

As shown in FIG. 19C, an upper clad layer 154 of p-type InP having a thickness of 0.25 μm is formed on the upper optical guide layer 153 formed with the main diffraction grating 170, by MOVPE.

A mask pattern 181 of silicon oxide is formed on the upper optical guide layer 154. The mask pattern 181 extends in the direction parallel to the periodicity direction of the main diffraction grating 170 and has periodical concave and convex portions on both side edges thereof for forming sub-diffraction gratings. A period of concave and convex portions is 400 nm, a height from the bottom of the concave portion to the upper surface of the convex portion is 250 nm and a duty ratio is 50%. The duty ratio may be set in the range of 35 to 65%. The convex portion on one side edge is located at the position corresponding to the convex portion of the other side edge.

By using the mask pattern 181 as a mask, the upper clad layer 154, upper optical guide layer 153 and quantum well active layer 152 are dry-etched and a surface layer of the substrate 151 is etched.

Figure 19D:
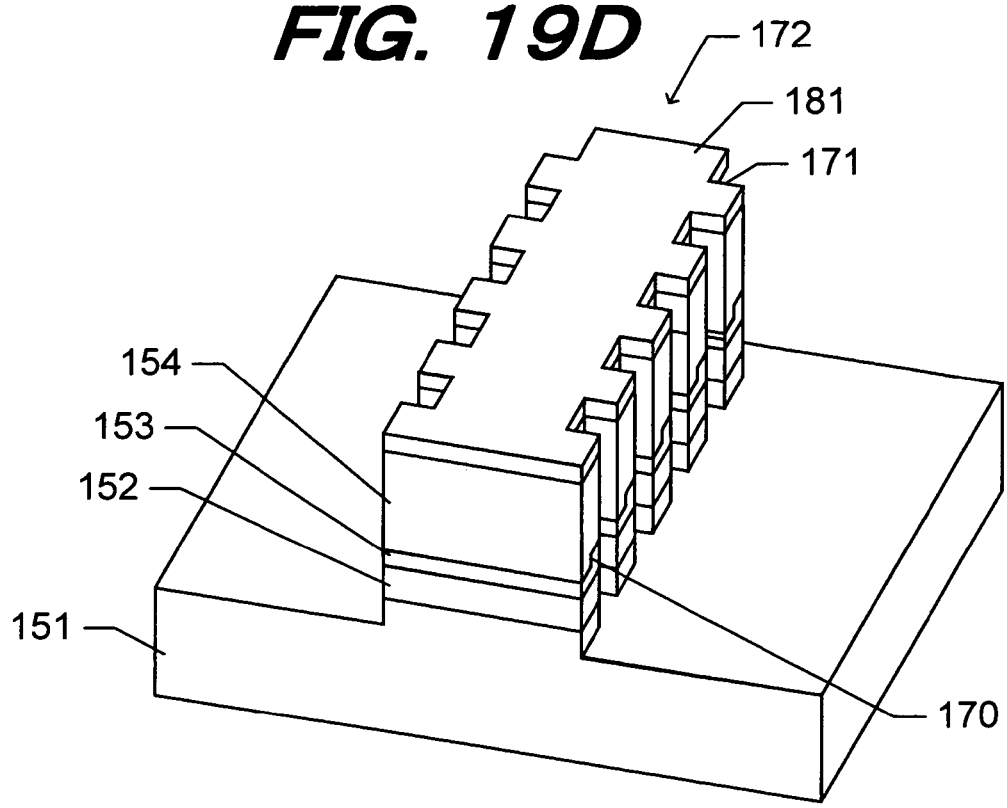

As shown in FIG. 19D, a ridge 172 therefore remains on the substrate 151, the ridge 172 having a lamination structure of the quantum well active layer 152, upper optical guide layer 153 and upper clad layer 154. Sub-diffraction grating 171 is therefore formed on both side surfaces of the ridge 172. The sub-diffraction grating 171 has a periodical structure that convex and concave portions extending in the height direction of the ridge 172 are alternately disposed in the longitudinal direction of the ridge 172.

Figure 19E:
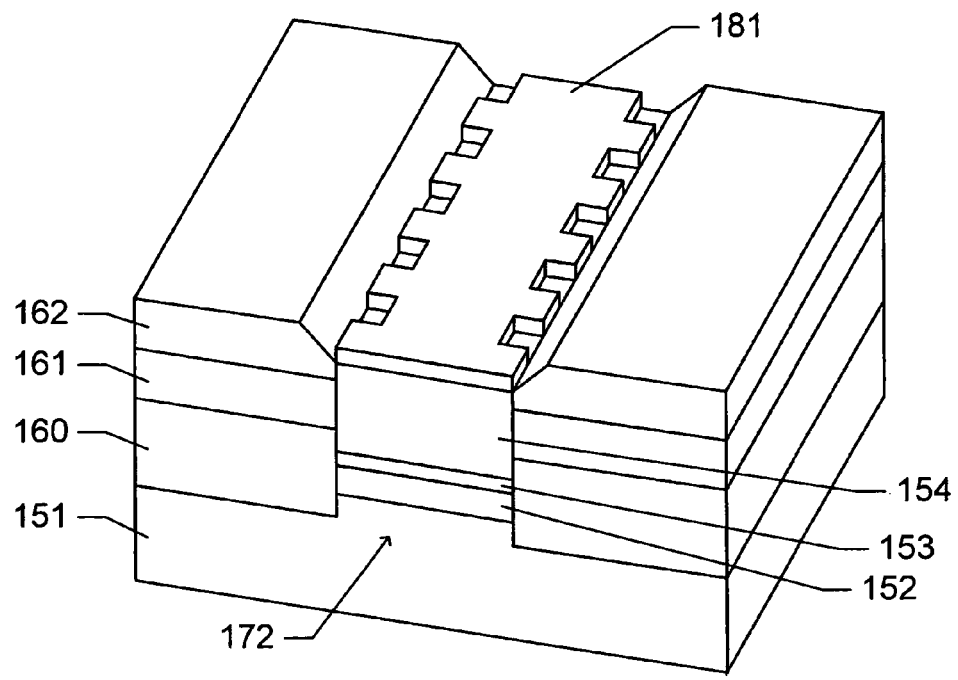

As shown in FIG. 19E, a first current confinement layer 160 of p-type InP, a second current confinement layer 161 of n-type InP and a third current confinement layer 162 of p-type InP are sequentially and selectively formed on flat surfaces on both sides of the ridge 172, by MOVPE. The mask pattern 181 is thereafter removed.

Figure 19F:
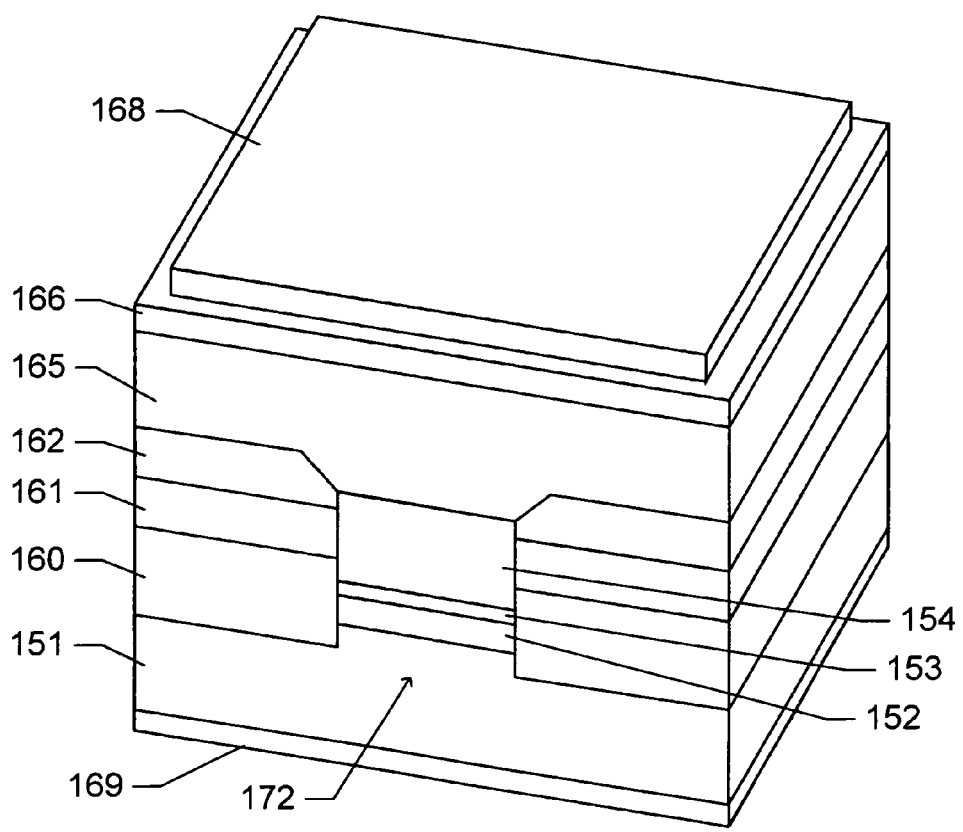
FIG. 19F is a perspective view of the buried-heterostructure laser diode of the tenth embodiment.

As shown in FIG. 19F, an upper clad layer 165 of p-type InP and a contact layer 166 of p-type GaInAs are sequentially grown on the upper clad layer 154, i.e., the uppermost layer of the ridge 172, and on the third current confinement layer 162, by MOVPE. A p-side electrode 168 is formed on the contact layer 166 by lift-off method, and an n-side electrode 169 is formed on the bottom surface of the substrate 151.

The quantum well active layer 152 disposed in the ridge 172 functions as the optical waveguide for propagating light in the longitudinal direction of the ridge 172.

In the buried-heterostructure laser diode of the tenth embodiment, the main diffraction grating 170 is disposed on the whole area in the width direction of the quantum well active layer 152 serving as the optical waveguide. The sub-diffraction grating 171 are not disposed in the central area in the width direction of the optical waveguide, but are disposed only on both sides of the optical waveguide. Therefore, the fundamental transverse mode of light propagating in the optical waveguide strongly couples the main diffraction grating 170, and the fundamental transverse mode weakly couples the sub-diffraction grating 171. Higher order transverse modes strongly couple both the main diffraction grating 170 and sub-diffraction grating 171. The main diffraction grating 170 is not necessary to be disposed in the whole area in the width direction of the optical waveguide, but the main diffraction grating may be disposed in a partial area including the central area in the width direction.

As in the case of the sub-diffraction gratings 12 of the ridge-waveguide DFB laser diode according to the first embodiment shown in FIGS. 1 to 3, the sub-diffraction grating 171 of the buried-heterostructure laser diode according to the tenth embodiment increases a propagation loss in higher order transverse modes. It is therefore possible to suppress oscillation of higher order transverse modes.

Figure 20:
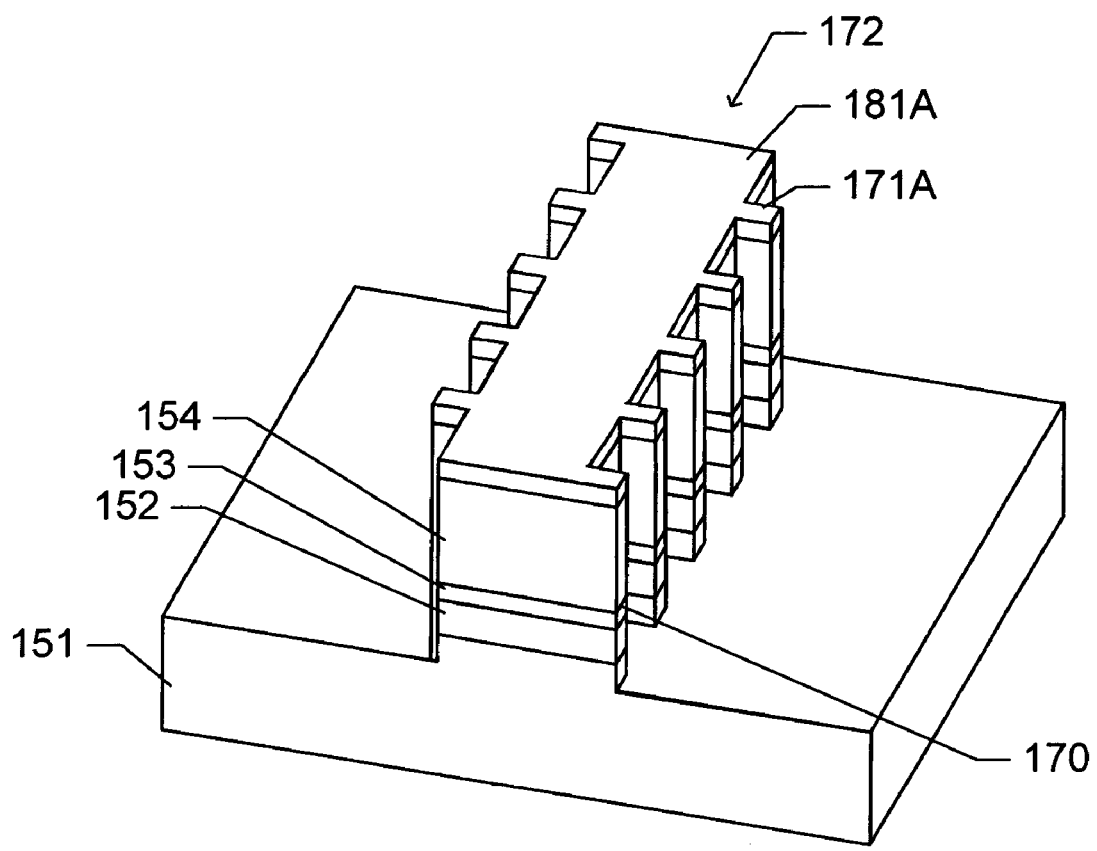
FIG. 20 is a perspective view illustrating a buried-heterostructure laser diode during manufacture according to an eleventh embodiment.

FIG. 20 is a perspective view illustrating a buried-heterostructure laser diode during manufacture according to the eleventh embodiment. The buried-heterostructure laser diode of the eleventh embodiment has a modified structure of the sub-diffraction grating 171 of the buried-heterostructure laser diode of the tenth embodiment shown in FIG. 19D.

In the eleventh embodiment, the phases of two portions of the sub-diffraction grating 171A disposed on both side surfaces of the ridge 172 are shifted by a half period of the main diffraction grating 170, i.e., by 100 nm. A period of the sub-diffraction grating 171A is 400 nm, and a duty ratio is in the range of 15 to 35% or in the range of 65 to 85%.

As in the case of the sub-diffraction grating 12A of the ridge-waveguide DFB laser diode according to the second embodiment shown in FIGS. 7 and 8, the sub-diffraction grating 171A of the buried-heterostructure laser diode of the eleventh embodiment increases a propagation loss in higher order transverse modes. It is therefore possible to suppress oscillation of higher order transverse modes.

Figure 21:
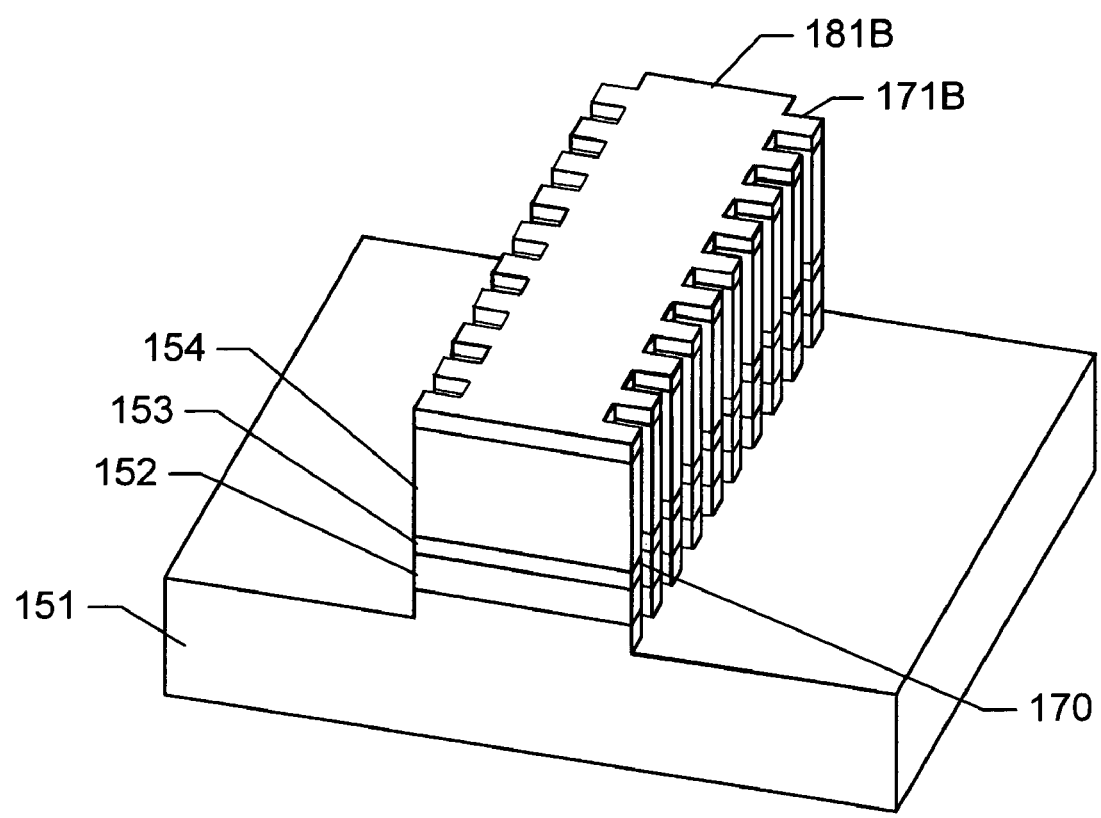
FIG. 21 is a perspective view illustrating a buried-heterostructure laser diode during manufacture according to a twelfth embodiment.

FIG. 21 is a perspective view illustrating a buried-heterostructure laser diode during manufacture according to the twelfth embodiment. The buried-heterostructure laser diode of the twelfth embodiment has a modified structure of the sub-diffraction grating 171 of the buried-heterostructure laser diode of the tenth embodiment shown in FIG. 19D.

Sub-diffraction grating 171B of the twelfth embodiment has the same period as that of the main diffraction grating 170. The periodical structure of a refractive index distribution is shifted by a half period, i.e., 100 nm, relative to that of the main diffraction grating 170. A duty ratio of the sub-diffraction grating 171B is in the range of 35 to 65%.

As in the case of the sub-diffraction grating 12C of the ridge-waveguide DFB laser diode according to the third embodiment shown in FIGS. 9 and 10, the sub-diffraction grating 171B of the buried-heterostructure laser diode according to the twelfth embodiment increases a propagation loss in higher order transverse modes. It is therefore possible to suppress oscillation of higher order transverse modes.

In the tenth to twelfth embodiments, although the main diffraction grating is disposed over the quantum well active layer 152, the main diffraction grating may be disposed under the quantum well active layer 152.

In any of the first to twelfth embodiments, light couples the main diffraction grating and sub-diffraction grating in such a manner that propagation of the second order transverse mode of light propagating in the optical waveguide when both the main and sub-diffraction gratings are disposed, is suppressed more than propagation of the second order transverse mode of light propagating in the optical waveguide when only the main diffraction grating is disposed.

Figure 22:
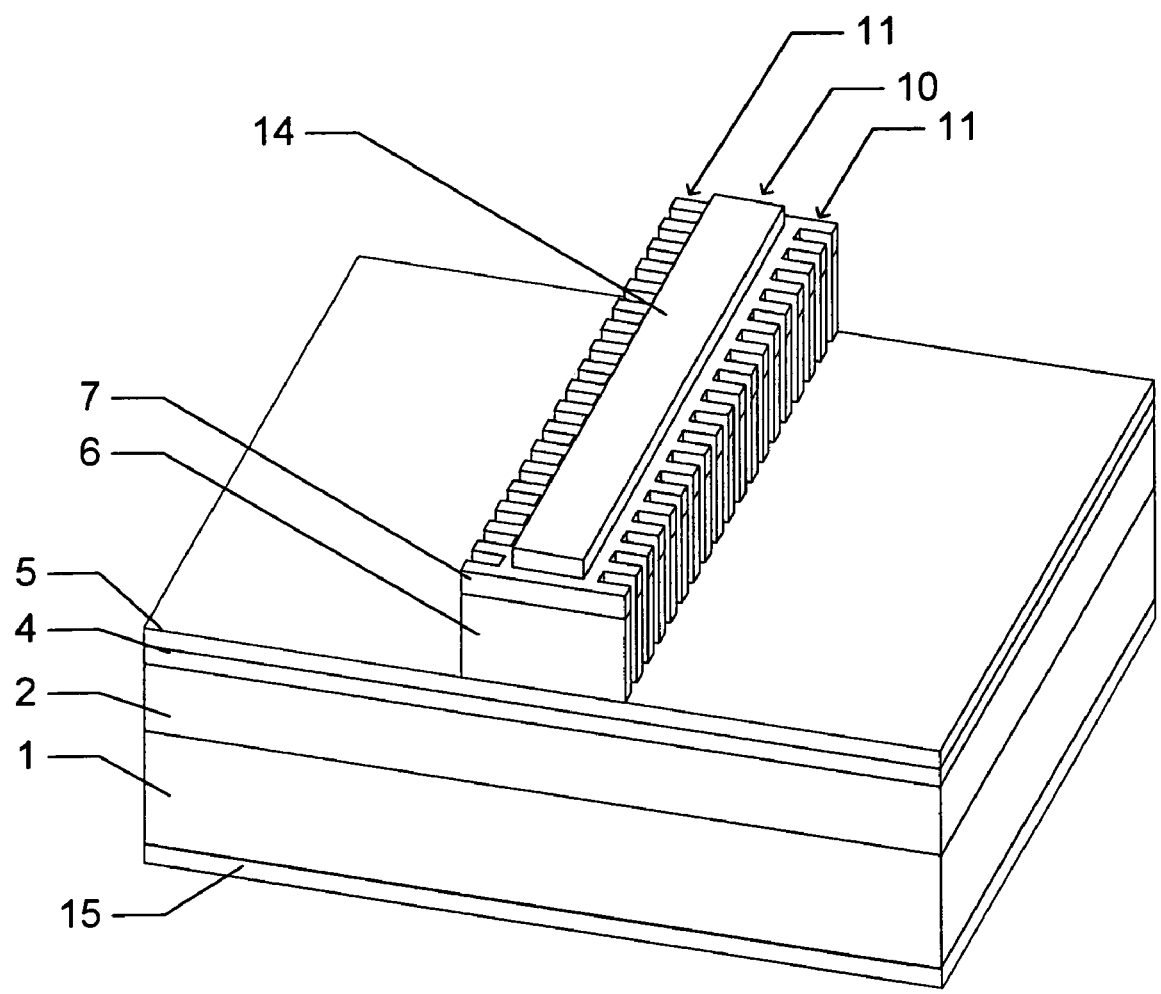
FIG. 22 is a perspective view illustrating a ridge-waveguide DFB laser diode during manufacture according to a thirteenth embodiment.

FIG. 22 is a perspective view showing a ridge-waveguide DFB laser diode according to the thirteenth embodiment. In the following description, attention is paid to different points from the ridge-waveguide DFB laser diode according to the modification of the first embodiment shown in FIG. 5.

In the modification of the first embodiment, although the sub-diffraction grating 12 is formed on the flat surfaces on both sides of the ridge 10, in the thirteenth embodiment, the sub-diffraction grating 12 are not formed. Other structures are the same as those of the ridge-waveguide DFB laser diode according to the modification of the first embodiment. The ridge-waveguide DFB laser diode of the thirteenth embodiment can be manufactured by forming only a resist pattern 8a for the main diffraction grating, without forming the resist pattern 8b for the sub-diffraction grating shown in FIG. 4C.

As in the case of the modification of the first embodiment, the thirteenth embodiment can also increase the coupling coefficient κ between light and the main diffraction grating 11. The upper optical guide layer 5 may be omitted, and the upper clad layer 6 may be disposed directly on the active layer 4.

In the thirteenth embodiment, since the sub-diffraction grating is not disposed, higher order transverse modes are more likely to oscillate, than the modification of the first embodiment. If oscillation of higher order transverse modes are serious in performance, oscillation of higher order transverse modes can be suppressed by narrowing the width of the ridge 10.

Figure 23:
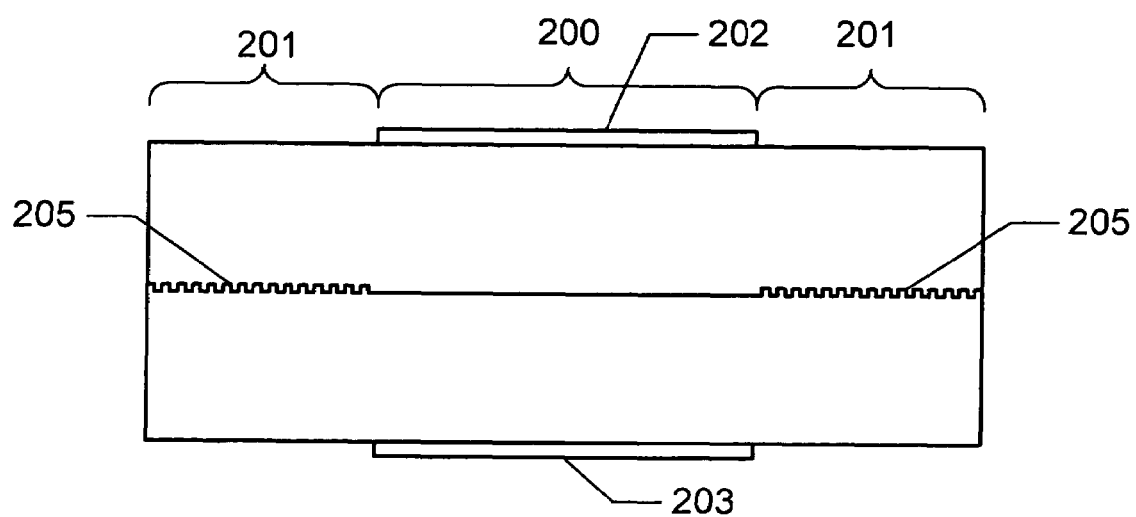
FIG. 23 is a cross sectional view of a DBR laser diode according to a fourteenth embodiment.
Figure 24:
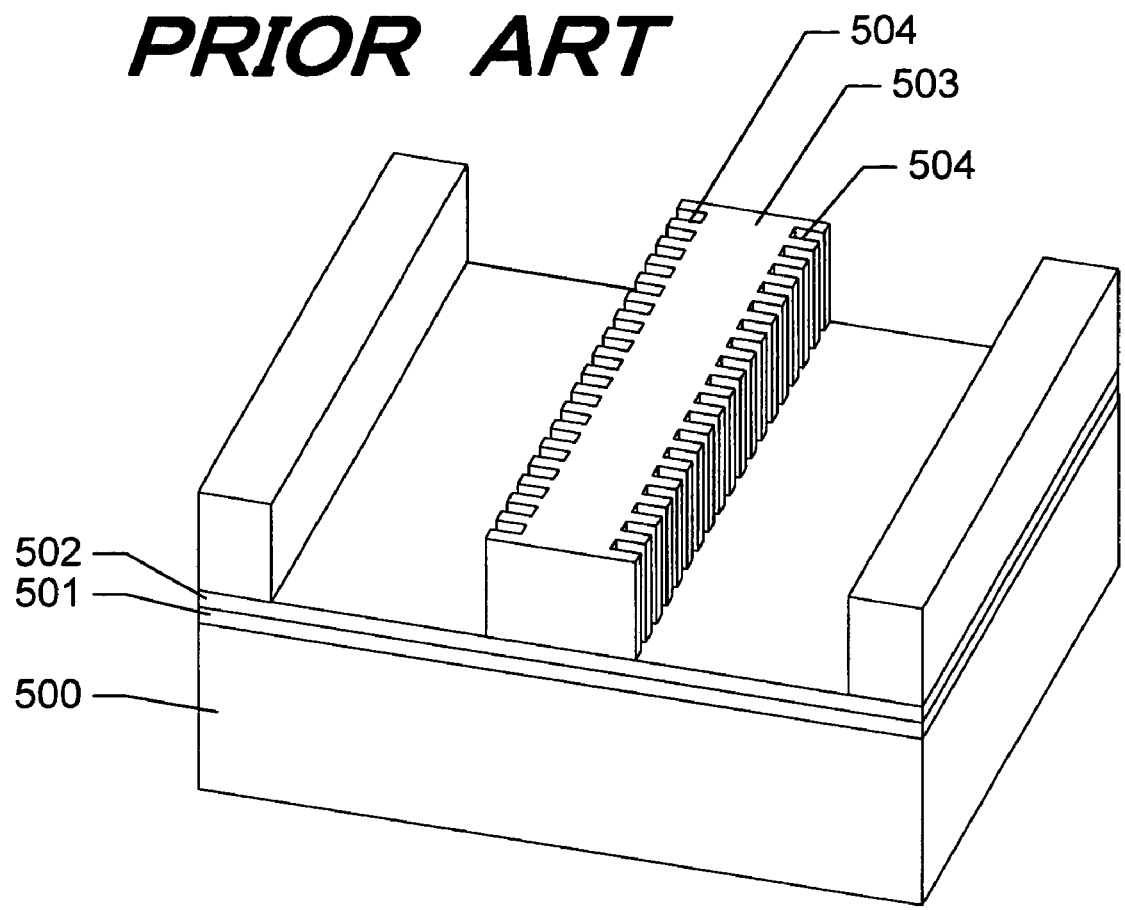
FIG. 24 is a perspective view of a conventional ridge-waveguide DFB laser diode.
Figure 25:
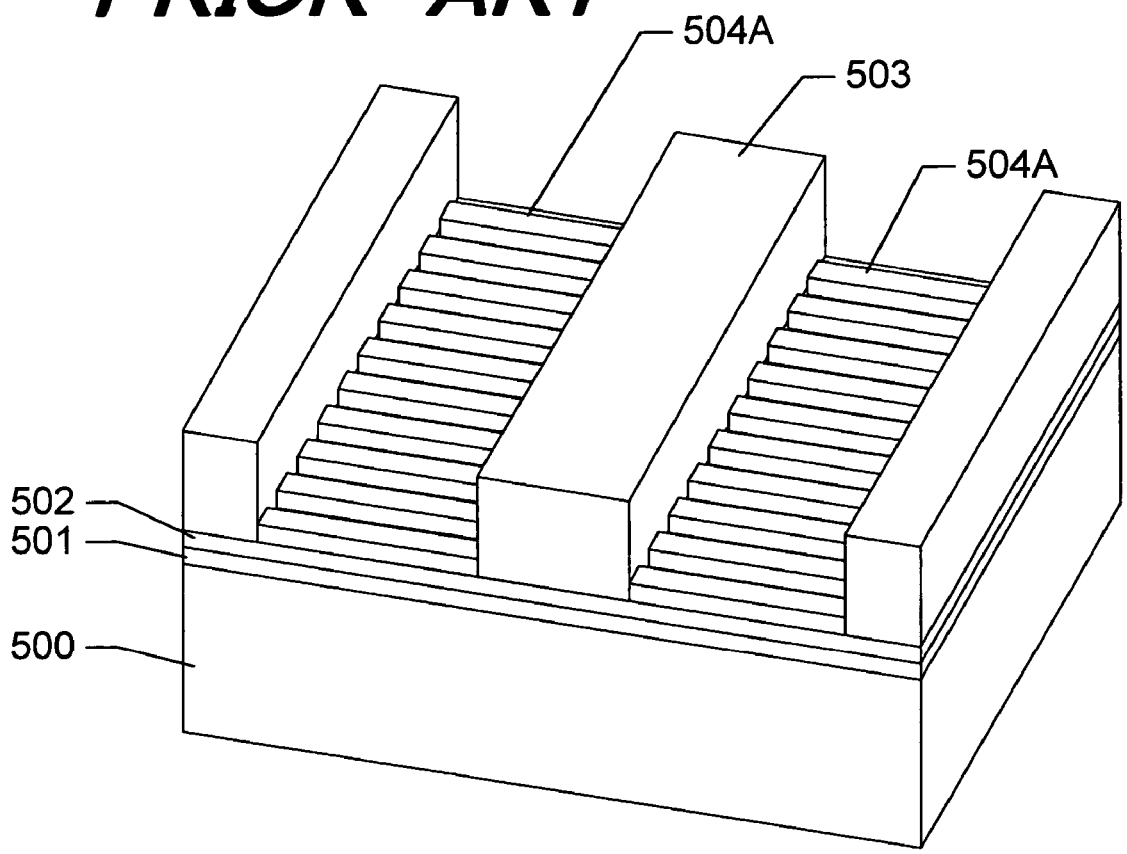
FIG. 25 is a perspective view of a conventional ridge-waveguide DFB laser diode.
Figure 26:
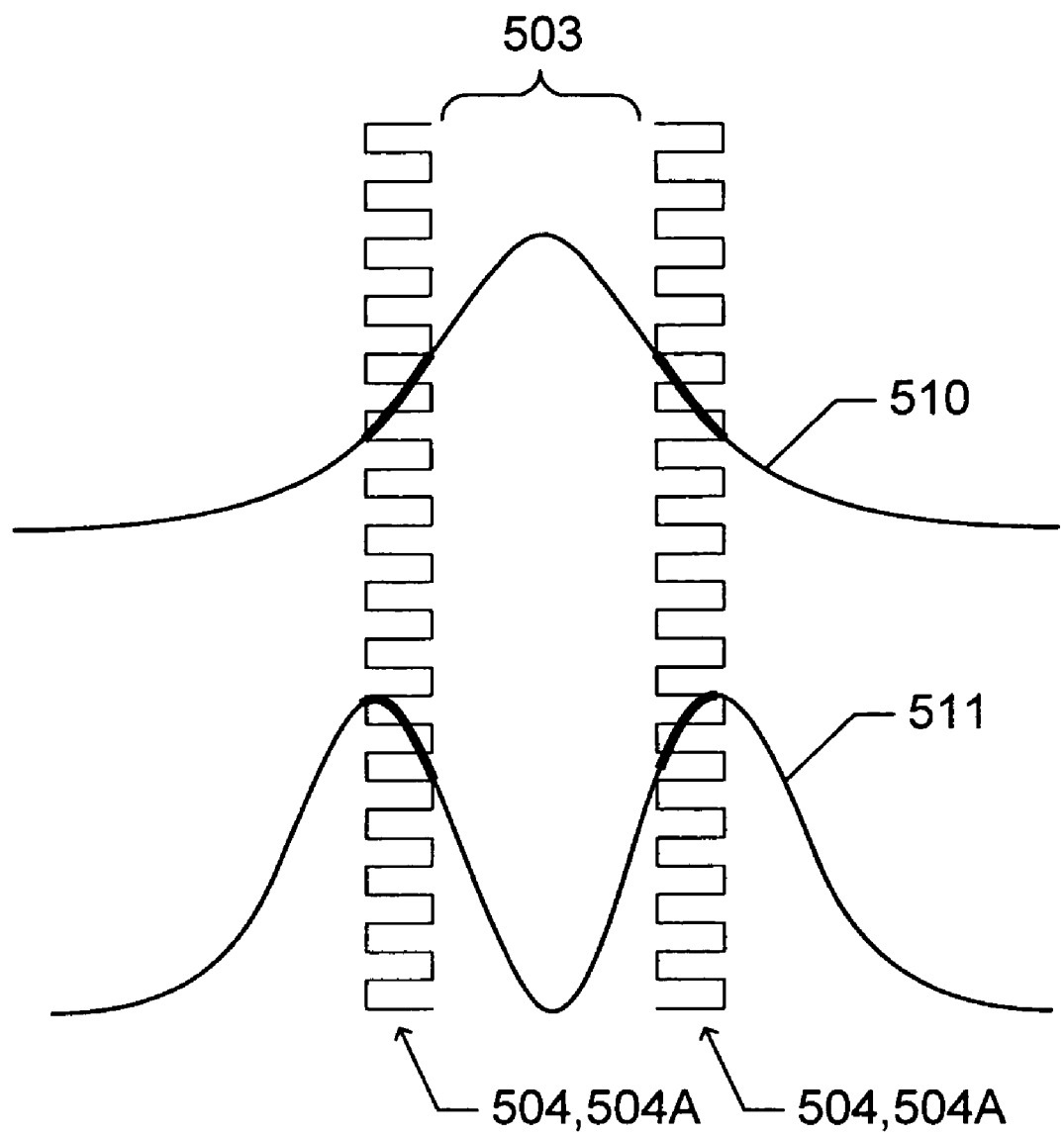
FIG. 26 is a diagram showing a position relation between the diffraction grating of a conventional ridge-waveguide DFB laser diode and the intensity distribution of light in the fundamental transverse mode and second order transverse mode.
Figure 27:
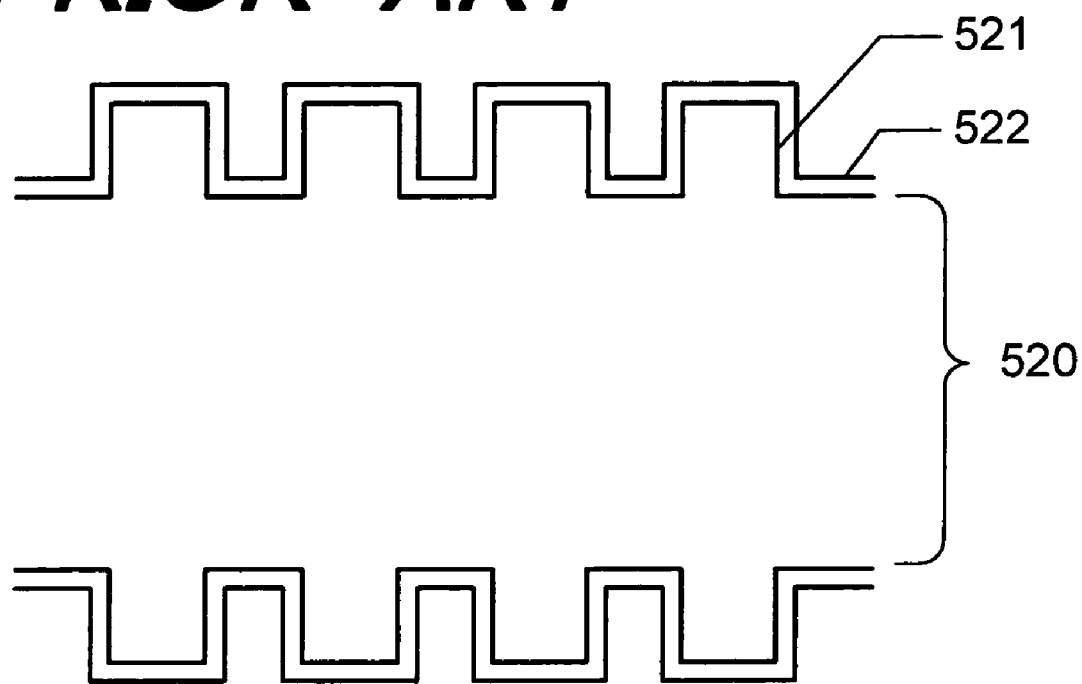
FIG. 27 is a horizontal cross sectional view of a conventional ridge-waveguide DFB laser diode.
Figure 28:
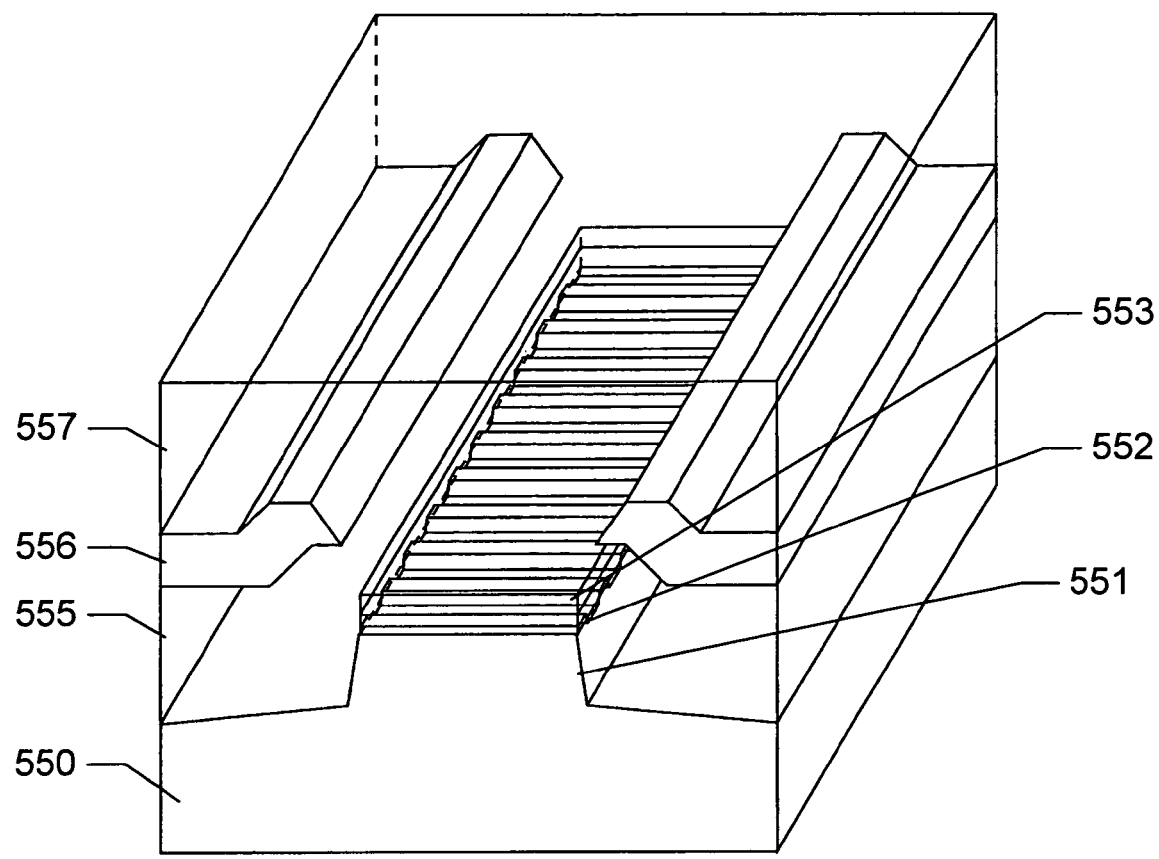
FIG. 28 is a perspective view of a conventional buried-heterostructure laser diode.
Figure 29:
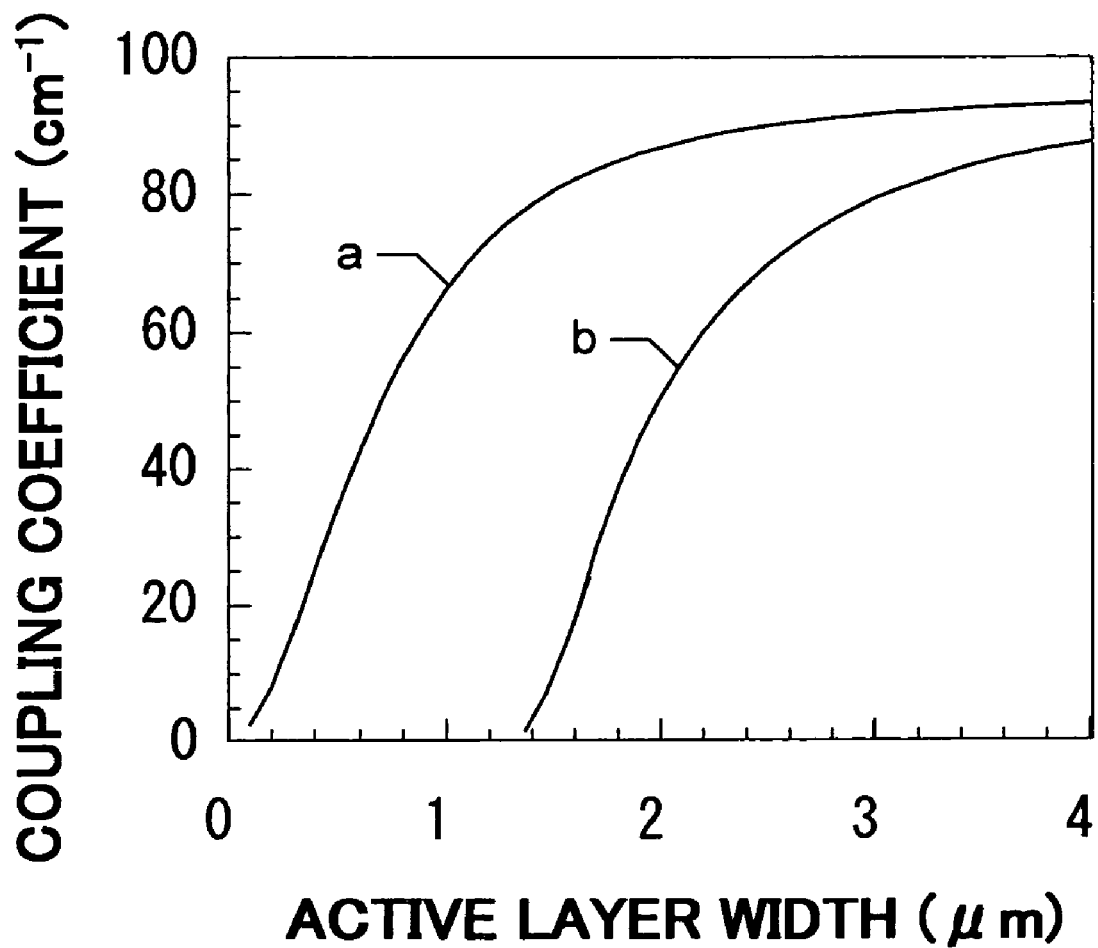
FIG. 29 is a graph showing the relation between an active layer width and a coupling coefficient of a conventional buried-heterostructure laser diode, a curve a indicating a coupling coefficient in the fundamental transverse mode and a curve b indicating a coupling coefficient in the second order transverse mode.

FIG. 23 is a schematic cross sectional view of a laser diode according to the fourteenth embodiment. Although the laser diodes of the first to twelfth embodiments are distributed-feedback (DFB) laser diodes, the laser diode of the fourteenth embodiment is a distributed Bragg reflector (DBR) laser diode.

In the DBR laser diode of the fourteenth embodiment, Bragg reflector regions 201 are disposed on both sides of an amplification region 200 in a light propagation direction. Carriers are injected into the amplification region 200 from electrodes 202 and 203. A diffraction gratings 205 are disposed in the Bragg reflector regions 201 to reflect light. Each of the diffraction gratings 205 includes the main diffraction grating and sub-diffraction grating of the laser diode of any one of the first to twelfth embodiments.

Since the diffraction gratings 205 in the Bragg reflector regions 201 increase a propagation loss in higher order transverse modes, oscillation of higher order modes can be suppressed.

As in the case of the diffraction gratings of the ridge-waveguide DFB laser diodes of the first to third, and thirteenth embodiments, in the fourteenth embodiment, it is preferable that if the diffraction gratings are disposed above the waveguide layer, a refractive index of medium disposed on the substrate side of the waveguide layer (same layer as the active layer in the amplification region 200) of the Bragg reflector region 201 is set lower than a refractive index of ridge medium disposed above the active layer 4. This refractive index distribution can increase the coupling coefficient κ between light and diffraction gratings, as in the case of the modification of the first embodiment shown in FIG. 5 and the thirteenth embodiment shown in FIG. 22.

In the laser diodes of the embodiments, GaAs, AlGaAs, InGaAs, InAs, InP, AlGaInAs, GaInAsP and the like are used for the materials of the substrate, clad layers, optical guide layers, active layer and the like. Other compound semiconductor materials may also be used. For example, in the first to third embodiments, the active layer containing InAs quantum dots is formed on the GaAs substrate. In the fourth to twelfth embodiments, the quantum well active layer of AlGaInAs is formed on the InP substrate. Instead, the quantum well active layer may be formed on a GaAs substrate, and the quantum dot active layer may be formed on an InP substrate.

In the embodiments, although sub-diffraction grating is made of semiconductor, other materials may also be used. For example, the sub-diffraction grating may be made of metal such as Cr.

In the embodiments using an n-type substrate, a p-type substrate may be used in place of the n-type substrate. If a p-type substrate is used, the optical guide layer, clad layer and the like formed above the active layer are made of n-type materials. A semi-insulating substrate may be used, or a bonded substrate may be used, the bonded substrate having a silicon substrate and an underlying substrate made of desired material bonded onto the silicon substrate.

Application fields of the main and sub-diffraction gratings adopted in the laser diodes of the first to twelfth embodiments are not limited to laser diodes. An optical waveguide equipped with the main and sub-diffraction gratings provides a function of increasing a loss of light in higher order transverse modes coupling the main diffraction grating and preferentially propagating the fundamental transverse mode.

The present invention has been described in connection with the preferred embodiments. The invention is not limited only to the above embodiments. It will be apparent to those skilled in the art that other various modifications, improvements, combinations, and the like can be made.

What we claim are:

1. An optical device comprising:
   an optical waveguide for propagating a laser beam;
   a main diffraction grating coupling light propagating in the optical waveguide; and
   a sub-diffraction grating coupling the light propagating in the optical waveguide,
   wherein the main diffraction grating and the sub-diffraction grating couple the light in such a manner that propagation in a second order transverse mode of the light propagating in the optical waveguide when both the main diffraction grating and the sub-diffraction grating are disposed, is suppressed more than propagation in the second order transverse mode of the light propagating in the optical waveguide when only the main diffraction grating is disposed,
   wherein the light propagating in the optical waveguide in the second transverse mode and coupling the main diffraction grating is diffracted by the sub-diffraction grating and re-couples the optical waveguide at a first re-coupling degree, the light propagating in the optical waveguide in the fundamental transverse mode and coupling the main diffraction grating is diffracted by the sub-diffraction grating and re-couples the optical waveguide at a second re-coupling degree, and the first re-coupling degree is lower than the second re-coupling degree.

2. The optical device according to claim 1,
   wherein a coupling coefficient between a fundamental transverse mode of the light and the sub-diffraction grating is smaller than a coupling coefficient between the second transverse mode of the light and the sub-diffraction grating, and a period of the sub-diffraction grating is at least 1.2 times longer than a period of the main diffraction grating.

3. The optical device according to claim 2, wherein the sub-diffraction grating has a structure that a first region having a first refractive index and a second region having a second refractive index are disposed alternately in a propagation direction of the light, a ratio of a region occupied by the first region to one period of the sub-diffraction grating is in a range of 35% 65%.

4. An optical device comprising:
   an optical waveguide for propagating a laser beam;
   a main diffraction grating coupling light propagating in the optical waveguide; and
   a sub-diffraction grating coupling the light propagating in the optical waveguide,
   wherein the main diffraction grating and the sub-diffraction grating couple the light in such a manner that propagation in a second order transverse mode of the light propagating in the optical waveguide when both the main diffraction grating and the sub-diffraction grating are disposed, is suppressed more than propagation in the second order transverse mode of the light propagating in the optical waveguide when only the main diffraction grating is disposed,
   wherein:
   a coupling coefficient between a fundamental transverse mode of the light and the sub-diffraction grating is smaller than a coupling coefficient between the second transverse mode and the sub-diffraction grating; and
   a period of the sub-diffraction grating is twice as long as a period of the main diffraction grating, the sub-diffraction grating includes a first periodical structure portion and a second periodical structure portion having a periodical refractive index distribution in a propagation direction of the light, and phases of the first periodical structure portion and the second periodical structure portion are shifted mutually by a half period of the main diffraction grating.

5. The optical device according to claim 4, wherein the first periodical structure portion and the second periodical structure portion have a structure that two types of regions having different refractive indices are alternately disposed in a propagation direction of the light, and a ratio of a region occupied by one of the first and second periodical structure portions to one period thereof is in a range of 15% to 35% or in a range of 65% to 85%.

6. An optical device comprising:
an optical waveguide for propagating a laser beam;
a main diffraction grating coupling light propagating in the optical waveguide; and
a sub-diffraction grating coupling the light propagating in the optical waveguide,
wherein the main diffraction grating and the sub-diffraction grating couple the light in such a manner that propagation in a second order transverse mode of the light propagating in the optical waveguide when both the main diffraction grating and the sub-diffraction grating are disposed, is suppressed more than propagation in the second order transverse mode of the light propagating in the optical waveguide when only the main diffraction grating is disposed,
wherein:
a coupling coefficient between a fundamental transverse mode of the light and the sub-diffraction grating is smaller than a coupling coefficient between the second transverse mode and the sub-diffraction grating; and
a period of the main diffraction grating is same as a period of the sub-diffraction grating, the main diffraction grating and the sub-diffraction grating have a periodical refractive index distribution in a propagation direction of the light, and a refractive index distribution of the sub-diffraction grating is shifted by 180° relative to the refractive index distribution of the main diffraction grating.

7. The optical device according to claim 1, wherein the optical waveguide is made of semiconductor, and the optical device further comprises electrodes supplying electrons and holes into the optical waveguide.

8. The optical device according to claim 7, further comprising:
a substrate having an active layer made of semiconductor and buried in a surface layer; and
a ridge disposed over a partial surface region of the substrate,
wherein a region of the active layer under the ridge serves as the optical waveguide, the main diffraction grating is formed on side surfaces of the ridge, and the sub-diffraction grating is formed on substrate surfaces on both sides of the ridge.

9. An optical device comprising:
an optical waveguide for propagating a laser beam;
a main diffraction grating coupling light propagating in the optical waveguide; and
a sub-diffraction grating coupling the light propagating in the optical waveguide,
wherein the main diffraction grating and the sub-diffraction grating couple the light in such a manner that propagation in a second order transverse mode of the light propagating in the optical waveguide when both the main diffraction grating and the sub-diffraction grating are disposed, is suppressed more than propagation in the second order transverse mode of the light propagating in the optical waveguide when only the main diffraction grating is disposed,
wherein the optical waveguide is made of semiconductor, and the optical device further comprises electrodes supplying electrons and holes into the optical waveguide, further comprising:
a substrate having an active layer made of semiconductor and buried in a surface layer; and
a ridge disposed over a partial surface region of the substrate,
wherein a region of the active layer under the ridge serves as the optical waveguide, the main diffraction grating is buried in a whole surface region of the substrate with respect to a width direction of the optical waveguide, and the sub-diffraction grating is formed on substrate surfaces on both sides of the ridge.

10. An optical device comprising:
an optical waveguide for propagating a laser beam;
a main diffraction grating coupling light propagating in the optical waveguide; and
a sub-diffraction grating coupling the light propagating in the optical waveguide,
wherein the main diffraction grating and the sub-diffraction grating couple the light in such a manner that propagation in a second order transverse mode of the light propagating in the optical waveguide when both the main diffraction grating and the sub-diffraction grating are disposed, is suppressed more than propagation in the second order transverse mode of the light propagating in the optical waveguide when only the main diffraction grating is disposed,
wherein the optical waveguide is made of semiconductor, and the optical device further comprises electrodes supplying electrons and holes into the optical waveguide, further comprising:
a substrate having an active layer made of semiconductor and buried in a surface layer; and
a ridge disposed over a partial surface region of the substrate,
wherein a region of the active layer under the ridge serves as the optical waveguide, the main diffraction grating is buried in a whole surface region of the substrate with respect to a width direction of the optical waveguide, and the sub-diffraction grating is not disposed just under the ridge, but is buried in regions of the substrate on both sides of the ridge.

11. An optical device comprising:
an optical waveguide for propagating a laser beam;
a main diffraction grating coupling light propagating in the optical waveguide; and
a sub-diffraction grating coupling the light propagating in the optical waveguide,
wherein the main diffraction grating and the sub-diffraction grating couple the light in such a manner that propagation in a second order transverse mode of the light propagating in the optical waveguide when both the main diffraction grating and the sub-diffraction grating are disposed, is suppressed more than propagation in the second order transverse mode of the light propagating in the optical waveguide when only the main diffraction grating is disposed,
wherein the optical waveguide is made of semiconductor, and the optical device further comprises electrodes supplying electrons and holes into the optical waveguide, further comprising:
a substrate having a ridge formed over a substrate surface; and
a burying layer covering flat surfaces of the semiconductor substrate on both sides of the ridge and side walls of the ridge,
wherein the optical waveguide is disposed in the ridge, the main diffraction grating is disposed in a region including a central region of the ridge in a width direction, and the sub-diffraction grating is formed on side surfaces of the ridge.

12. An optical device comprising:
a semiconductor substrate;

a lower clad layer formed over the semiconductor substrate;

an active layer made of medium having a refractive index higher than a refractive index of the lower clad layer;

an upper clad layer of a ridge shape extending in one direction over a partial area of the active layer, the upper clad layer being made of medium having a refractive index higher than the refractive index of the lower clad layer, a region of the active layer under a ridge constituted of the upper clad layer serving as an optical waveguide; and a diffraction grating having a periodicity in an extending direction of the ridge and disposed above the active layer, wherein the diffraction grating comprises main diffraction grating and sub-diffraction grating coupling light propagating in the optical waveguide, and the main diffraction grating and the sub-diffraction grating couple the light in such a manner that propagation in a second order transverse mode of the light propagating in the optical waveguide when both the main diffraction grating and the sub-diffraction grating are disposed, is suppressed more than propagation in the second order transverse mode of the light propagating in the optical waveguide when only the main diffraction grating is disposed, wherein the light propagating in the optical waveguide in the second order transverse mode and coupling the main diffraction grating is diffracted by the sub-diffraction grating and re-couples the optical waveguide at a first re-coupling degree, the light propagating in the optical waveguide in a fundamental transverse mode and coupling the main diffraction grating is diffracted by the sub-diffraction grating and re-couples the optical waveguide at a second re-coupling degree, and the first re-coupling degree is lower than the second re-coupling degree.

13. An optical device comprising:

a semiconductor substrate;

a lower clad layer formed over the semiconductor substrate;

an active layer made of medium having a refractive index higher than a refractive index of the lower clad layer;

an upper clad layer of a ridge shape extending in one direction over a partial area of the active layer, the upper clad layer being made of medium having a refractive index higher than the refractive index of the lower clad layer, a region of the active layer under a ridge constituted of the upper clad layer serving as an optical waveguide; and a diffraction grating having a periodicity in an extending direction of the ridge and disposed above the active layer, wherein the diffraction grating comprises main diffraction grating and sub-diffraction grating coupling light propagating in the optical waveguide, and the main diffraction grating and the sub-diffraction grating couple the light in such a manner that propagation in a second order transverse mode of the light propagating in the optical waveguide when both the main diffraction grating and the sub-diffraction grating are disposed, is suppressed more than propagation in the second order transverse mode of the light propagating in the optical waveguide when only the main diffraction grating is disposed, wherein:

a coupling coefficient between a fundamental transverse mode of the light and the sub-diffraction grating is smaller than a coupling coefficient between the second order transverse mode and the sub-diffraction grating; and a period of the main diffraction grating is same as a period of the sub-diffraction grating, the main diffraction grating and the sub-diffraction grating have a periodical refractive index distribution in a propagation direction of the light, and a refractive index distribution of the sub-diffraction grating is shifted by 180° relative to the refractive index distribution of the main diffraction grating.

14. The optical device according to claim 12, wherein a coupling coefficient between the fundamental transverse mode of the light and the sub-diffraction grating is smaller than a coupling coefficient between the second order transverse mode of the light and the sub-diffraction grating, and a period of the sub-diffraction grating is at least 1.2 times longer than a period of the main diffraction grating.

15. The optical device according to claim 4 further comprising:

a semiconductor substrate;

a lower clad layer formed over the semiconductor substrate;

an active layer made of medium having a refractive index higher than a refractive index of the lower clad layer; and an upper clad layer of a ridge shape extending in one direction over a partial area of the active layer, the upper clad layer being made of medium having a refractive index higher than the refractive index of the lower clad layer, when a region of the active layer under the upper clad layer serves as the optical waveguide, and the main diffraction grating and the sub-diffraction grating are disposed over the active layer.

* * * * *